US 9,076,505 B2

(12) United States Patent
Atsumi et al.

(10) Patent No.: US 9,076,505 B2
(45) Date of Patent: Jul. 7, 2015

(54) MEMORY DEVICE

(71) Applicant: Semiconductor Energy Laboratory Co., Ltd., Atsugi-shi, Kanagawa-ken (JP)

(72) Inventors: Tomoaki Atsumi, Kanagawa (JP); Takashi Okuda, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 180 days.

(21) Appl. No.: 13/705,587

(22) Filed: Dec. 5, 2012

(65) Prior Publication Data

US 2013/0148411 A1  Jun. 13, 2013

(30) Foreign Application Priority Data

Dec. 9, 2011  (JP) .................. 2011-269712
Jan. 20, 2012  (JP) .................. 2012-009731

(51) Int. Cl.
*G11C 11/24* (2006.01)
*G11C 8/08* (2006.01)
(Continued)

(52) U.S. Cl.
CPC ...... *G11C 8/08* (2013.01); *G11C 11/24* (2013.01); *H01L 27/0207* (2013.01); *H01L 27/10882* (2013.01); *H01L 27/10897* (2013.01);
(Continued)

(58) Field of Classification Search
USPC ........... 365/149, 150, 185.07, 185.13, 191, 365/230.06
See application file for complete search history.

(56) References Cited

U.S. PATENT DOCUMENTS 4,466,081 A  8/1984  Masuoka
5,060,191 A  10/1991  Nagasaki et al.
(Continued)

FOREIGN PATENT DOCUMENTS

EP  1 737 044 A1  12/2006
EP  2 226 847 A2  9/2010
(Continued)

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center, with full English translation.

(Continued)

*Primary Examiner* — Pho M Luu
(74) *Attorney, Agent, or Firm* — Fish & Richardson P.C.

(57) ABSTRACT

A memory device including first to fourth memory cell arrays and a driver circuit including a pair of bit line driver circuits and a pair of word line driver circuits is provided. The first to fourth memory cell arrays are overlap with the driver circuit. Each of the pair of bit line driver circuits and a plurality of bit lines are connected through connection points on an edge along the boundary between the first and second memory cell arrays or on an edge along the boundary between the third and fourth memory cell arrays. Each of the pair of word line driver circuits and a plurality of word lines are connected through second connection points on an edge along the boundary between the first and fourth memory cell arrays or on an edge along the boundary between the second and third memory cell arrays.

9 Claims, 24 Drawing Sheets

(51) Int. Cl.

| | |
|---|---|
| H01L 27/02 | (2006.01) |
| H01L 27/108 | (2006.01) |
| H01L 27/12 | (2006.01) |
| G11C 11/404 | (2006.01) |
| G11C 11/4097 | (2006.01) |

(52) U.S. Cl.
CPC .......... H01L27/1225 (2013.01); G11C 11/404 (2013.01); G11C 11/4097 (2013.01)
USPC . 365/149; 365/150; 365/185.07; 365/185.13; 365/191; 365/230.06

(56) References Cited

U.S. PATENT DOCUMENTS

| | | | |
|---|---|---|---|
| 5,349,366 A | 9/1994 | Yamazaki et al. | |
| 5,375,085 A | 12/1994 | Gnade et al. | |
| 5,731,856 A | 3/1998 | Kim et al. | |
| 5,744,864 A | 4/1998 | Cillessen et al. | |
| 5,822,258 A | 10/1998 | Casper | |
| 6,127,702 A | 10/2000 | Yamazaki et al. | |
| 6,294,274 B1 | 9/2001 | Kawazoe et al. | |
| 6,445,026 B1 | 9/2002 | Kubota et al. | |
| 6,504,742 B1 | 1/2003 | Tran et al. | |
| 6,563,174 B2 | 5/2003 | Kawasaki et al. | |
| 6,577,531 B2 | 6/2003 | Kato | |
| 6,690,598 B2 | 2/2004 | Oguchi et al. | |
| 6,727,522 B1 | 4/2004 | Kawasaki et al. | |
| 6,765,844 B2 | 7/2004 | Fujisawa et al. | |
| 6,791,863 B2 | 9/2004 | Oguchi et al. | |
| 6,846,703 B2 | 1/2005 | Shimoda et al. | |
| 6,881,975 B2 | 4/2005 | Anzai et al. | |
| 6,972,985 B2 | 12/2005 | Rinerson et al. | |
| 7,026,647 B2 | 4/2006 | Wu et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,189,992 B2 | 3/2007 | Wager, III et al. | |
| 7,209,376 B2 | 4/2007 | Saito et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,339,187 B2 | 3/2008 | Wager, III et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,554,169 B2 | 6/2009 | Anzai et al. | |
| 7,663,174 B2 | 2/2010 | Shibata | |
| 7,674,650 B2 | 3/2010 | Akimoto et al. | |
| 7,696,063 B2 | 4/2010 | Tsuchiya | |
| 7,729,195 B2 * | 6/2010 | Youn et al. ............... | 365/230.06 |
| 7,732,819 B2 | 6/2010 | Akimoto et al. | |
| 7,888,207 B2 | 2/2011 | Wager, III et al. | |
| 7,910,490 B2 | 3/2011 | Akimoto et al. | |
| 7,932,521 B2 | 4/2011 | Akimoto et al. | |
| 7,939,831 B2 | 5/2011 | Anzai et al. | |
| 8,008,137 B2 | 8/2011 | Wu et al. | |
| 8,036,010 B2 | 10/2011 | Maejima | |
| 8,134,861 B2 * | 3/2012 | Nakadai ......................... | 365/154 |
| 8,179,707 B2 | 5/2012 | Song et al. | |
| 8,274,077 B2 | 9/2012 | Akimoto et al. | |
| 8,314,032 B2 | 11/2012 | Kawamura et al. | |
| 8,378,403 B2 | 2/2013 | Kato | |
| 8,482,001 B2 | 7/2013 | Yamazaki et al. | |
| 8,508,967 B2 | 8/2013 | Yamazaki et al. | |
| 8,610,187 B2 | 12/2013 | Yamazaki et al. | |
| 8,737,109 B2 * | 5/2014 | Yamazaki et al. ............... | 365/72 |
| 8,797,785 B2 * | 8/2014 | Saito ............................ | 365/149 |
| 8,817,551 B2 * | 8/2014 | Kuroda .................... | 365/189.05 |
| 2001/0001073 A1 | 5/2001 | Yamazaki et al. | |
| 2001/0015450 A1 | 8/2001 | Sugibayashi et al. | |
| 2001/0046027 A1 | 11/2001 | Tai et al. | |
| 2002/0018357 A1 | 2/2002 | Oguchi et al. | |
| 2002/0056838 A1 | 5/2002 | Ogawa | |
| 2002/0132454 A1 | 9/2002 | Ohtsu et al. | |
| 2003/0057423 A1 | 3/2003 | Shimoda et al. | |
| 2003/0107926 A1 | 6/2003 | Ohmura et al. | |
| 2003/0189401 A1 | 10/2003 | Kido et al. | |
| 2003/0202404 A1 | 10/2003 | Scheuerlein | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0245555 A1 | 12/2004 | Ueda | |
| 2004/0251461 A1 | 12/2004 | Anzai et al. | |
| 2004/0257847 A1 | 12/2004 | Matsui et al. | |
| 2005/0017302 A1 | 1/2005 | Hoffman | |
| 2005/0162933 A1 | 7/2005 | Madurawe | |
| 2005/0199959 A1 | 9/2005 | Chiang et al. | |
| 2005/0243595 A1 | 11/2005 | Rinerson et al. | |
| 2005/0280000 A1 | 12/2005 | Ishii et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0216877 A1 | 9/2006 | Toyota et al. | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0128815 A1 | 6/2007 | Iino et al. | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0263423 A1 | 11/2007 | Scheuerlein et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0108198 A1 | 5/2008 | Wager, III et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197414 A1 | 8/2008 | Hoffman et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |

(56) References Cited

U.S. PATENT DOCUMENTS

| | | |
|---|---|---|
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0315193 A1 | 12/2008 | Kim et al. |
| 2009/0002590 A1 | 1/2009 | Kimura |
| 2009/0008638 A1 | 1/2009 | Kang et al. |
| 2009/0008639 A1 | 1/2009 | Akimoto et al. |
| 2009/0027371 A1 | 1/2009 | Lin et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1 | 5/2009 | Wang et al. |
| 2009/0121233 A1 | 5/2009 | Yasukawa |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0154262 A1 | 6/2009 | Tokunaga |
| 2009/0184315 A1 | 7/2009 | Lee et al. |
| 2009/0230435 A1 | 9/2009 | Maejima |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0102397 A1 | 4/2010 | Park et al. |
| 2010/0109002 A1 | 5/2010 | Itagaki et al. |
| 2010/0136743 A1 | 6/2010 | Akimoto et al. |
| 2010/0140608 A1 | 6/2010 | Park et al. |
| 2010/0148171 A1 | 6/2010 | Hayashi et al. |
| 2010/0213531 A1 | 8/2010 | Asami et al. |
| 2010/0276685 A1 | 11/2010 | Itagaki et al. |
| 2010/0276689 A1 | 11/2010 | Iwasaki |
| 2010/0279462 A1 | 11/2010 | Iwasaki |
| 2011/0089417 A1 | 4/2011 | Yamazaki et al. |
| 2011/0089419 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0104851 A1 | 5/2011 | Akimoto et al. |
| 2011/0108706 A1 | 5/2011 | Koyama |
| 2011/0108836 A1 | 5/2011 | Koyama et al. |
| 2011/0110145 A1 | 5/2011 | Yamazaki et al. |
| 2011/0116310 A1 | 5/2011 | Yamazaki et al. |
| 2011/0117697 A1 | 5/2011 | Akimoto et al. |
| 2011/0121285 A1 | 5/2011 | Yamazaki et al. |
| 2011/0121286 A1 | 5/2011 | Yamazaki et al. |
| 2011/0121290 A1 | 5/2011 | Akimoto et al. |
| 2011/0122670 A1 | 5/2011 | Yamazaki et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0156027 A1 | 6/2011 | Yamazaki et al. |
| 2011/0163311 A1 | 7/2011 | Akimoto et al. |
| 2011/0207251 A1 | 8/2011 | Anzai et al. |
| 2011/0299318 A1 | 12/2011 | Kaneko et al. |
| 2012/0057396 A1 | 3/2012 | Yamazaki et al. |
| 2012/0063207 A1 | 3/2012 | Kato et al. |
| 2012/0063208 A1 | 3/2012 | Koyama et al. |
| 2012/0063209 A1 | 3/2012 | Koyama et al. |
| 2012/0120715 A1 | 5/2012 | Saito |
| 2012/0161127 A1 | 6/2012 | Kato et al. |
| 2012/0161132 A1 | 6/2012 | Yamazaki |
| 2012/0182790 A1 | 7/2012 | Yamazaki et al. |
| 2012/0188814 A1 | 7/2012 | Yamazaki et al. |
| 2013/0056728 A1 | 3/2013 | Morosawa et al. |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-288498 A | 11/1988 |
| JP | 05-109272 A | 4/1993 |
| JP | 05-120875 A | 5/1993 |
| JP | 05-251705 A | 9/1993 |
| JP | 05-266670 A | 10/1993 |
| JP | 05-342875 A | 12/1993 |
| JP | 06-097366 A | 4/1994 |
| JP | 06-267268 A | 9/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-319682 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-012358 A | 1/2006 |
| JP | 2007-096055 A | 4/2007 |
| JP | 2009-135350 A | 6/2009 |
| JP | 2010-177431 | 8/2010 |
| JP | 2011-109084 A | 6/2011 |
| WO | 2004/114391 A1 | 12/2004 |

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

(56) References Cited

OTHER PUBLICATIONS

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SIG Digest '09: SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) ,2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

(56) References Cited

OTHER PUBLICATIONS

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display,"AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

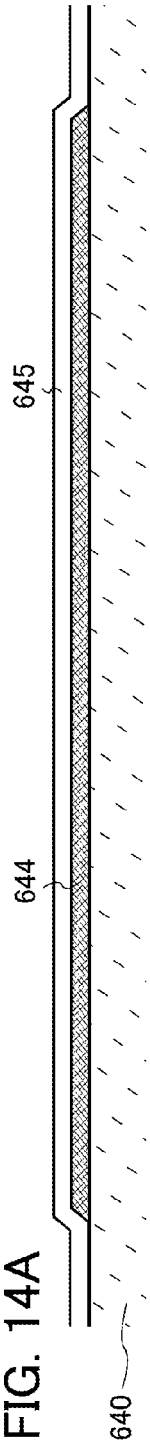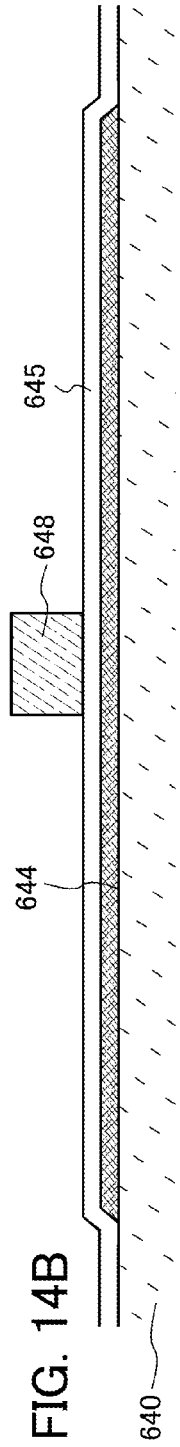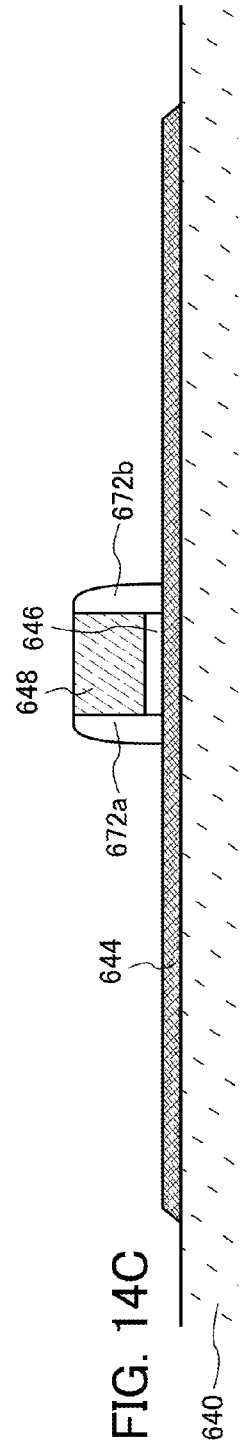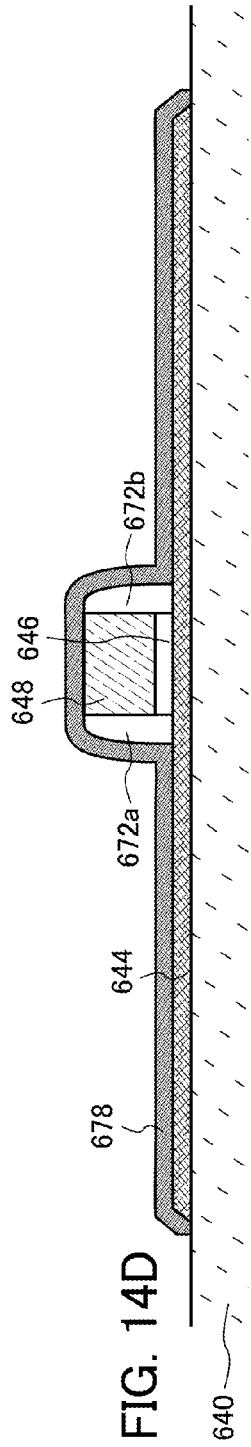

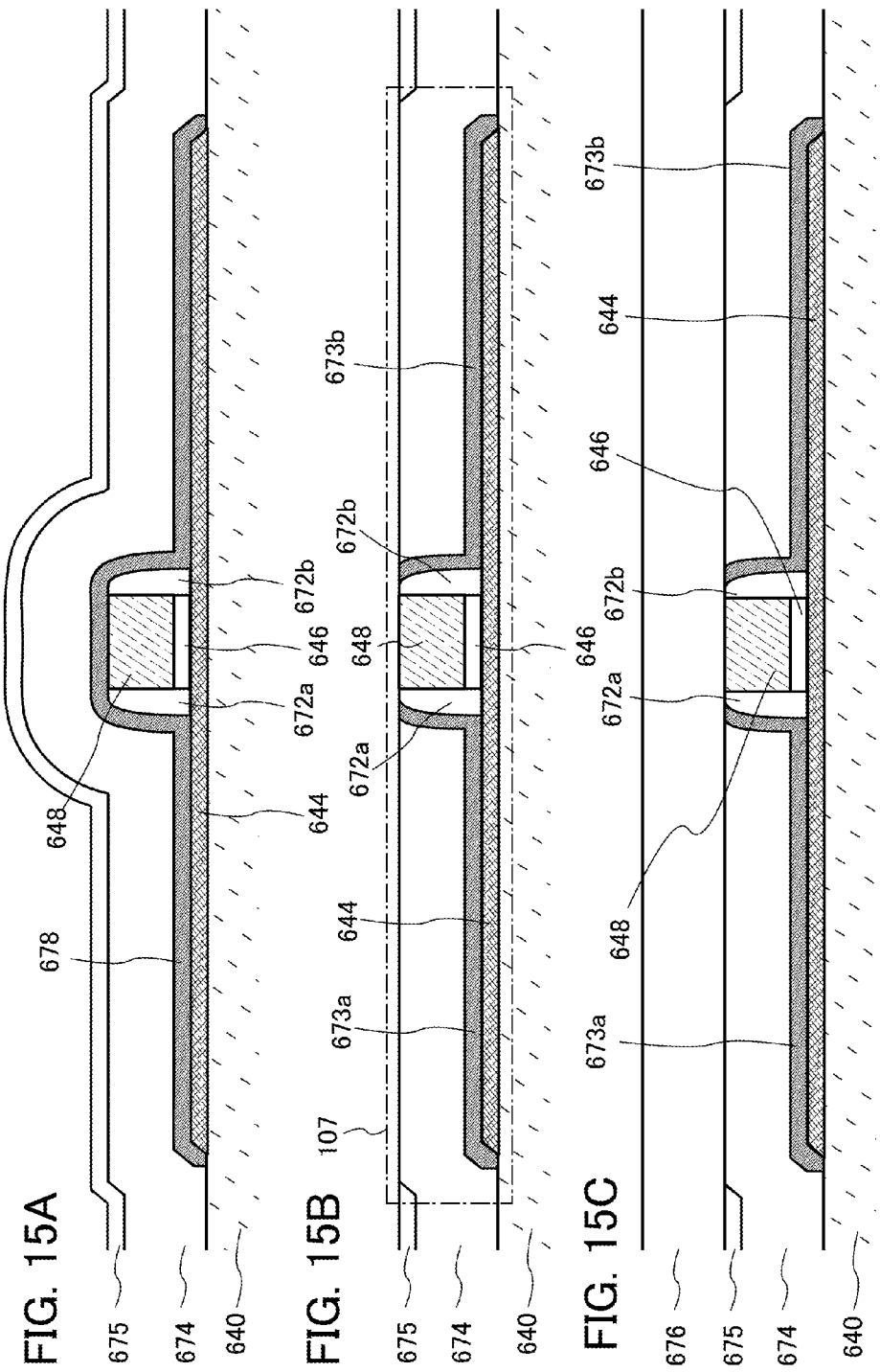

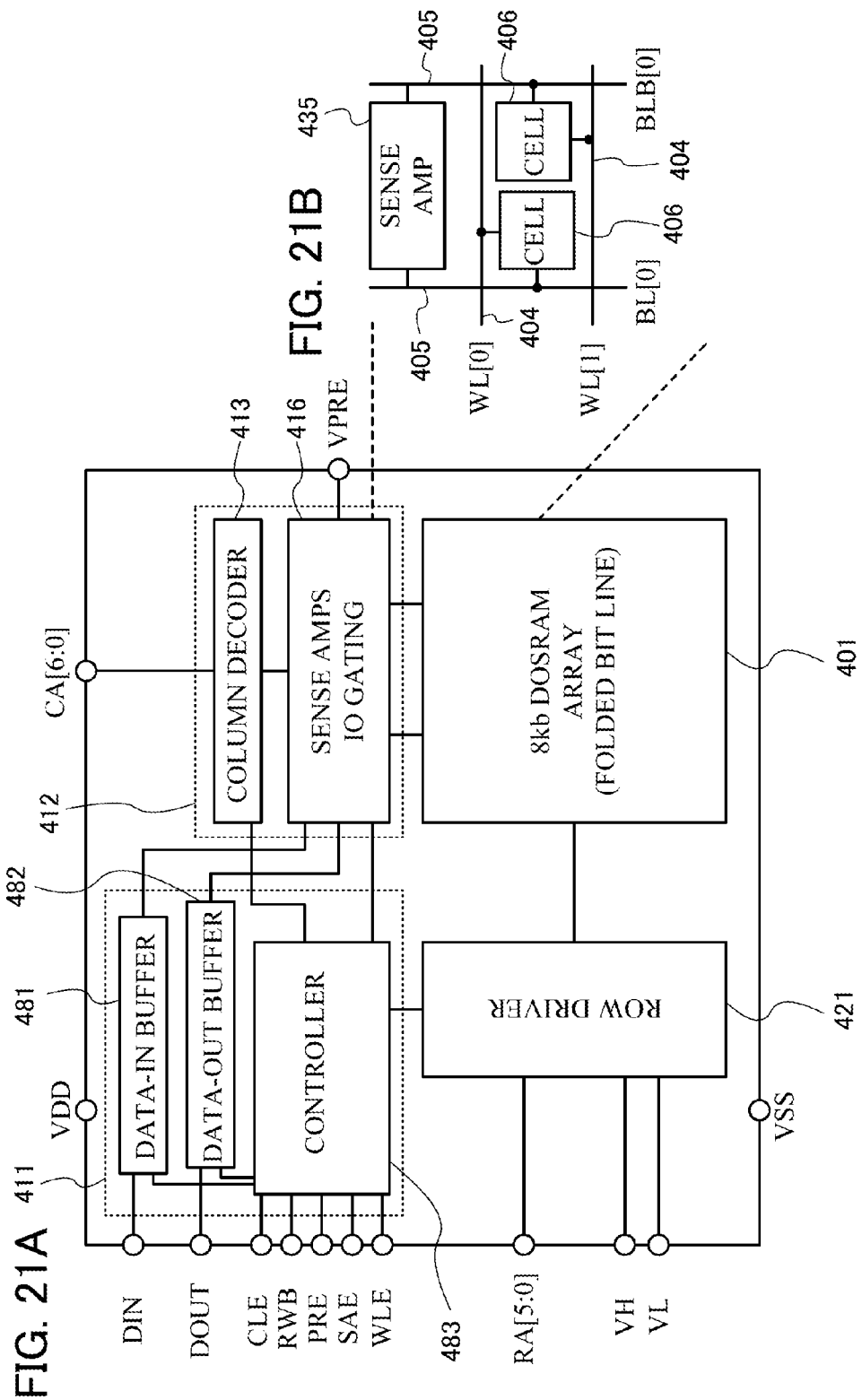

MEMORY DEVICE

BACKGROUND OF THE INVENTION

1. Field of the Invention

One aspect of the disclosed invention relates to memory devices and a manufacturing method thereof.

2. Description of the Related Art

A technique by which transistors are formed using semiconductor thin films formed over a substrate having an insulating surface has attracted attention. Transistors are used for display devices (typically, a liquid crystal television), memory devices where memory elements are arranged in matrix, and the like. Silicon is known as a material for a semiconductor thin film applicable to a transistor; however, an oxide semiconductor has attracted attention in recent years (see Patent Document 1).

REFERENCE

[Patent Document 1] Japanese Published Patent Application No. 2011-109084

SUMMARY OF THE INVENTION

Examples of a semiconductor memory device (hereinafter also simply referred to as a memory device) include a DRAM and an SRAM, which are categorized as volatile memories; a mask ROM, an EPROM, an EEPROM, a flash memory, and a ferroelectric memory which are categorized as non-volatile memories; and the like. Most of these memories formed using single crystal semiconductor substrates have already been put into practical use. Among the above memory devices, a DRAM has a simple structure in which a memory cell includes a transistor and a capacitor and needs fewer semiconductor elements for forming a memory cell than other memory devices such as an SRAM. Therefore, memory capacity per unit area can be increased as compared to other memory devices, thereby realizing cost reduction.

When a memory element of a DRAM includes a transistor having an oxide semiconductor in a channel formation region (hereinafter, referred to as "oxide semiconductor transistor") as a switching element of a memory cell in a memory element, since an oxide semiconductor transistor has an extremely low leakage current in an off state (off-state current), a DRAM having long retention time and a low refresh frequency can be formed.

A DRAM is suitable for increasing storage capacity as described above, but in order to increase degree of integration of an integrated circuit and suppress an increase in a chip size, memory capacity per unit area needs to be further increased as in other memory devices. For that purpose, the area of a capacitor configured to hold electric charge and provided in each memory cell has to be reduced in order to reduce the area of each memory cell.

However, a reduction in the area of the capacitor causes a decrease in the capacitance value, which results in a small difference between the amounts of electric charge corresponding to different digital values. Thus, if the value of off-state current of the transistor is high, it is difficult to maintain the accuracy of data, and a holding period tends to be short. Accordingly, frequency of refresh operation is increased and power consumption is increased.

If the number of memory cells in DRAM is increased in order to achieve large storage capacity, the number of memory cells that are connected to one bit line or the length of one bit line which is led is increased. Thus, the parasitic capacitance and the parasitic resistance of the bit line are increased. Therefore, when the difference between the amounts of electric charge of digital values becomes smaller because of a reduction in the area of the capacitor, it is difficult to accurately read the above difference in the amount of electric charge (i.e., data) through the bit line, which results in increase in the incidence of error.

Further, an increase in the number of memory cells causes an increase in the number of memory cells which are connected to one word line or the length of one word line which is led, as in the case of the bit line. Thus, the parasitic capacitance and the parasitic resistance of the word line are increased; accordingly, the pulses of signals input to the word line are delayed or the potential drop of the word line becomes larger. As a result, when a signal for controlling switching of the transistor is supplied to a memory cell through a word line, malfunction in a series of operations such as data writing, holding, and reading occurs; for example, data is not written to the memory cell, data is lost because the memory cell does not sufficiently hold the data, or data is not accurately read from the memory cell because it takes so much time to read the data. Thus, the incidence of error increases.

In view of the above problems, an object of one aspect of the disclosed invention is to obtain a memory device in which a period for holding data is ensured and memory capacity per unit area is increased. Another object of one aspect of the disclosed invention is to obtain a memory device in which the incidence of error is reduced and memory capacity per unit area is increased. Another object of one aspect of the disclosed invention is to realize a highly reliable semiconductor device with the use of the above memory device.

A memory device of one mode of the disclosed invention includes a memory cell array in which a plurality of memory cells are arranged. Each of the memory cells includes an oxide semiconductor transistor functioning as a switching element and a storage capacitor electrically connected to the oxide semiconductor transistor.

Since an oxide semiconductor transistor has extremely low leakage current in an off state, a memory cell can have a long data retention time.

One of a source and a drain of the oxide semiconductor transistor is electrically connected to a bit line. The other of the source and the drain of the oxide semiconductor transistor is electrically connected to one terminal of the storage capacitor. A gate of the oxide semiconductor transistor is electrically connected to a word line. A low power supply potential VSS (e.g., ground potential GND) is applied to the other terminal of the storage capacitor.

A bit line driver circuit electrically connected to bit lines and a word line driver circuit electrically connected to word lines are stacked to entirely or partly overlap with the memory cell array. The bit line driver circuit and the word line driver circuit are each electrically connected to the memory cell array through connection wirings.

Since the memory cell array and each of the bit line driver circuit and the word line driver circuit are stacked, a memory device can have higher memory capacity per unit area.

Note that when a connection point of the connection wiring and the bit line and a connection point of the connection wiring and the word line are provided on the periphery of the memory cell array, the parasitic resistance of the bit line and the parasitic resistance of the word line are high. For this reason, the connection point of the connection wiring and the bit line and the connection point of the connection wiring and the word line are provided on the edges along the boundary between adjacent memory cell arrays.

Providing the connection points on the edges along the boundary between adjacent memory cell arrays can reduce the parasitic resistances of the bit line and the word line to half in comparison with the case of providing the connection points on the periphery of the memory cell array; that is, the parasitic resistances of the bit line and the word line can be reduced.

More preferably, a connection point of the connection wiring and the bit line is provided to minimize the resistance value of the resistance of a connection wiring and the resistance value of the parasitic resistance of the bit line, or a connection point of the connection wiring and the word line is provided to minimize the resistance value of the resistance of a connection wiring and the resistance value of the parasitic resistance of the word line. Thus, the parasitic resistances of the bit line and the word line can be minimized.

When a bit line is divided in two lines and the two lines are electrically connected to first and second terminals of an amplifying element, respectively, with the use of a connection wiring through connection points, the length of one of the two lines can be half a length of the bit line which is not divided; accordingly, a capacitance value of parasitic capacitance becomes half.

A reduction in parasitic capacitances and parasitic resistances of the bit line and the word line achieves a memory device having a lower incidence of errors.

One mode of the disclosed invention relates to a memory device that includes a first bit line driver circuit and a second bit line driver circuit that are provided to be centrally symmetric, a first word line driver circuit and a second word line driver circuit that are provided to be centrally symmetric, a first memory cell array including a first bit line and a first word line and overlapping with at least part of the first bit line driver circuit, a second memory cell array including a second bit line and a second word line and overlapping with at least part of the first word line driver circuit, a third memory cell array sharing a third bit line and the second word line with the second memory cell array, and a fourth memory cell array sharing a fourth bit line and the first word line with the first memory cell array. The first word line is connected to the second word line driver circuit on an edge along a boundary between the first memory cell array and the fourth memory cell array. The second word line is connected to the first word line driver circuit on an edge along a boundary between the second memory cell array and the third memory cell array. The first bit line and the second bit line are connected to the first bit line driver circuit on an edge along a boundary between the first memory cell array and the second memory cell array. The third bit line and the fourth bit line are connected to the second bit line driver circuit on an edge along a boundary between the third memory cell array and the fourth memory cell array.

In one aspect of the disclosed invention, the first bit line driver circuit includes an amplifying element configured to amplify a potential difference between the first bit line and the second bit line, and the second bit line driver circuit includes an amplifying element configured to amplify a potential difference between the third bit line and the fourth bit line.

In one mode of the disclosed invention, the bit line driver circuits each include a decoder, a selector and a reading circuit, and the word line driver circuits each include a decoder, a level shifter, and a buffer.

In one mode of the disclosed invention, memory cells are adjacent to the intersections of the plurality of bit lines and the plurality of word lines. The memory cells each include an oxide semiconductor transistor that is a switching element, and a storage capacitor electrically connected to one of a source and a drain of the oxide semiconductor transistor.

According to one aspect of the disclosed invention, a memory device can have a sufficient data retention period and a higher memory capacity per unit area. According to another aspect of the disclosed invention, a memory device can have a lower incidence of errors and a higher memory capacity per unit area. According to another aspect of the disclosed invention, employing the memory device realizes a highly reliable semiconductor device.

BRIEF DESCRIPTION OF THE DRAWINGS

FIGS. 14A to 14D are cross-sectional views illustrating a process for manufacturing an oxide semiconductor transistor.
FIGS. 15A to 15C are cross-sectional views illustrating a process for manufacturing an oxide semiconductor transistor.
FIGS. 21A and 21B illustrate a circuit configuration of a memory device.

DETAILED DESCRIPTION OF THE INVENTION

Figure 1:
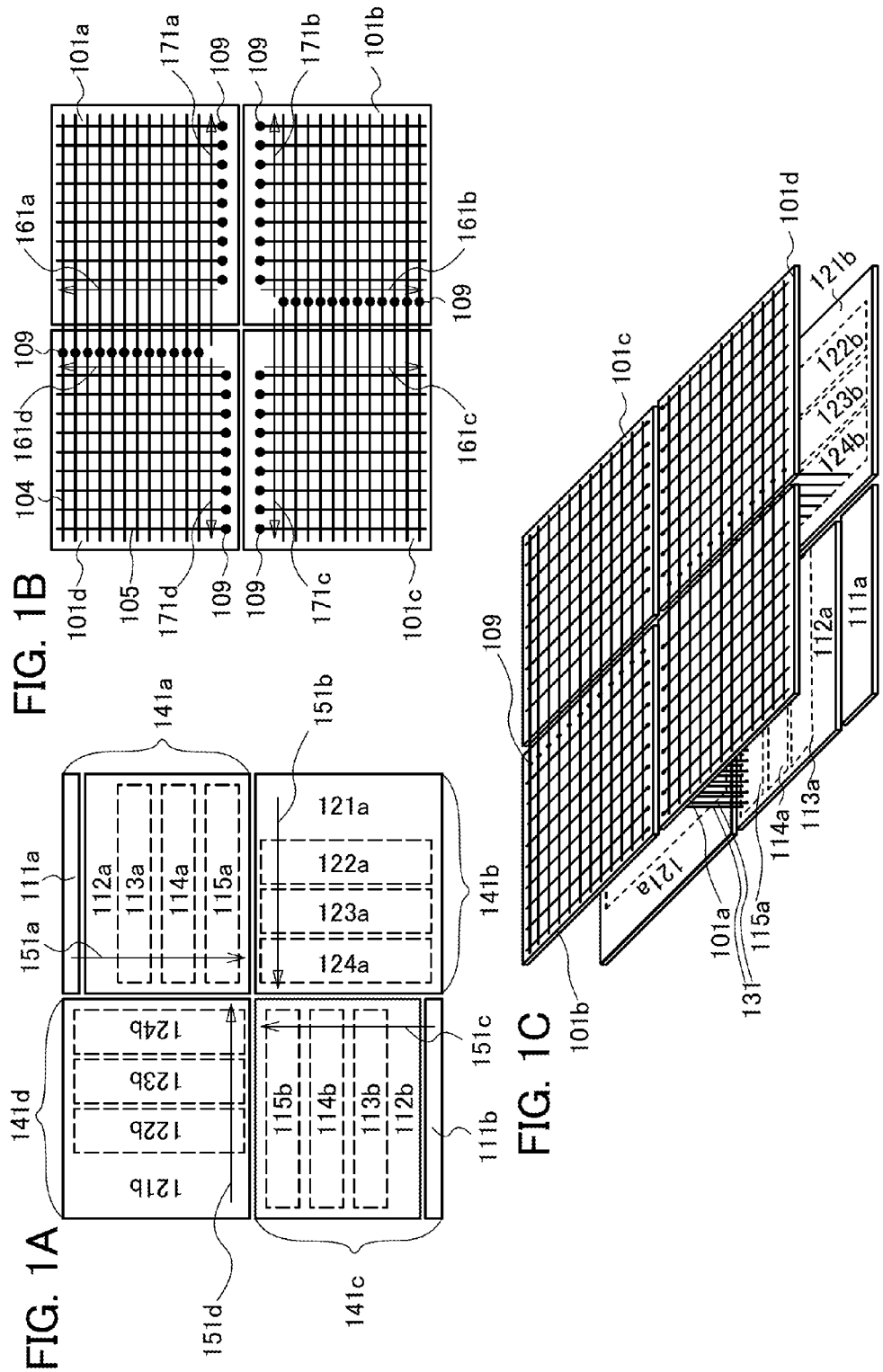
FIGS. 1A and 1B are top views of a memory device and FIG. 1C is a perspective view of a memory device.

Aspects of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the present invention is not construed as being limited to description of the embodiment. Note that in the drawings hereinafter shown, the same portions or portions having similar functions are denoted by the same reference numerals, and repeated description thereof will be omitted.

In the invention disclosed in this specification, a semiconductor device refers to an element or a device which utilizes a semiconductor for its operation and includes, in its category an electric device including an electronic circuit, a display device, a light-emitting device, and the like and an electronic appliance on which the electric device is mounted.

Note that the position, size, range, or the like of each structure shown in the drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

<Structure of Memory Device>

FIGS. 1A to 1C illustrates a structure of a memory device of this embodiment. The memory device illustrated in FIG. 1A includes a first sub-module 141a, a second sub-module 141b, a third sub-module 141c, and a fourth sub-module 141d. The first sub-module 141a includes a first input/output circuit 111a and a first bit line driver circuit 112a that includes a first decoder 113a, a first selector 114a, and a first reading circuit 115a. The second sub-module 141b includes a first word line driver circuit 121a that includes a second decoder 122a, a first level shifter 123a, and a first buffer 124a. The third sub-module 141c includes a second input/output circuit 111b and a second bit line driver circuit 112b that includes a third decoder 113b, a second selector 114b, and a second reading circuit 115b. The fourth sub-module 141d includes a second word line driver circuit 121b that includes a fourth decoder 122b, a second level shifter 123b, and a second buffer 124b.

In the memory device illustrated in FIGS. 1A to 1C, a memory cell array 101a, a memory cell array 101b, a memory cell array 101c, and a memory cell array 101d are provided to be stacked over the first sub-module 141a, the second sub-module 141b, the third sub-module 141c, the fourth sub-module 141d, respectively (see FIG. 1C). Note that each of the memory cell arrays 101a to 101d may have a stacked structure.

In the memory device illustrated in FIG. 1A, the first bit line driver circuit 112a and the second bit line driver circuit 112b are provided to be centrally symmetric with respect to the center of the first to fourth sub-modules 141a to 141d. The first word line driver circuit 121a and the second word line driver circuit 121b are also provided to be centrally symmetric with respect to the center of the first to fourth sub-modules 141a to 141d. The first bit line driver circuit 112a is adjacent to the first word line driver circuit 121a and the second word line driver circuit 121b. The first word line driver circuit 121a is adjacent to the first bit line driver circuit 112a and the second bit line driver circuit 112b. The second bit line driver circuit 112b is adjacent to the first word line driver circuit 121a and the second word line driver circuit 121b.

Bit lines 105 are provided to extend from the memory cell array 101a to the memory cell array 101b and from the memory cell array 101c to the memory cell array 101d. Word lines 104 are provided to extend from the memory cell array 101a to the memory cell array 101d and from the memory cell array 101b to the memory cell array 101c (see FIG. 1B).

Figure 2:
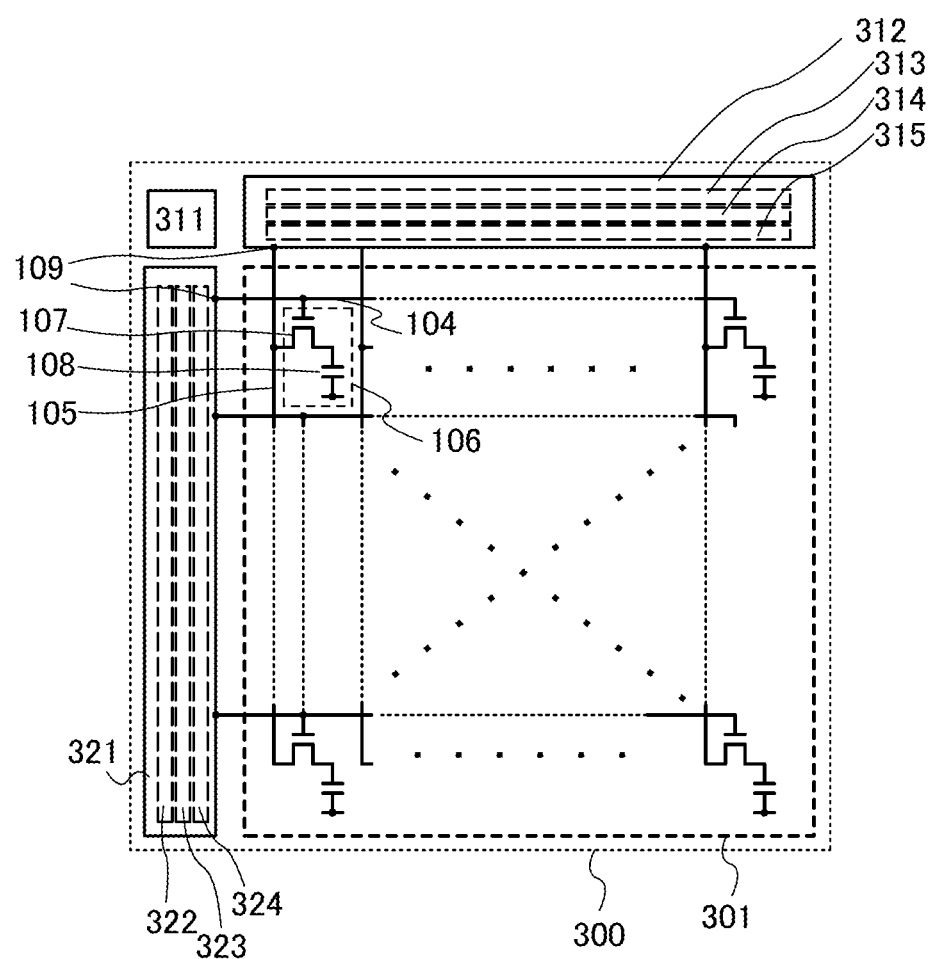
FIG. 2 illustrates a circuit configuration of a memory device.

The memory cell arrays 101a to 101d are each formed by dimensional arrangement of a plurality of memory cells 106 (see FIG. 2).

Figure 3A:
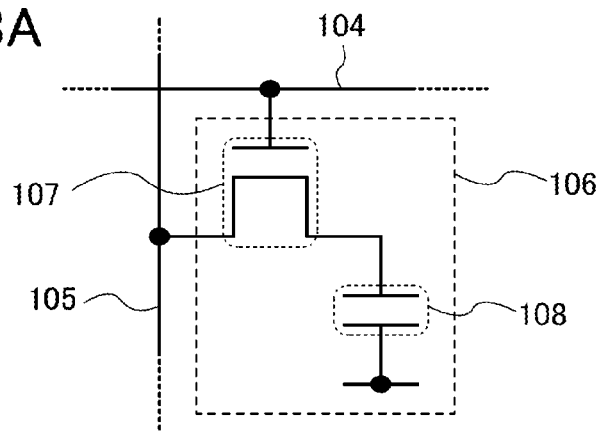
FIGS. 3A to 3D are circuit diagrams of a memory device.

The structure of the memory cell 106 adjacent to the intersection of the bit line 105 and the word line 104 is described with reference to FIG. 3A.

The memory cell 106 is composed of an oxide semiconductor transistor 107, the bit line 105, the word line 104, and a storage capacitor 108. The oxide semiconductor transistor 107 is a switching element. The bit line 105 is electrically connected to one of a source and a drain of the oxide semiconductor transistor 107. The word line 104 is electrically connected to a gate of the oxide semiconductor transistor 107. One terminal of the storage capacitor 108 is electrically connected to the other of the source and the drain of the oxide semiconductor transistor 107. A low power supply potential VSS (e.g., ground potential GND) is applied to the other terminal of the storage capacitor 108.

As shown in FIG. 1B, each bit line 105 in the memory cell arrays 101a and 101b has a connection point 109 on the edges along a boundary between the memory cell arrays 101a and 101b (in both the memory cell arrays 101a and 101b) in order to be connected to a connection wiring 131 (see FIG. 1C). Each bit line 105 in the memory cell arrays 101c and 101d has a connection point 109 on the edges along a boundary between the memory cell arrays 101c and 101d (in both the memory cell arrays 101c and 101d) in order to be connected to a connection wiring 131. Each word line 104 in the memory cell arrays 101a and 101d has the connection point 109 on the edge of the memory cell array 101d along a boundary between the memory cell arrays 101a and 101d in order to be connected to a connection wiring 131. Each word line 104 in the memory cell arrays 101b and 101c has the connection point 109 on the edge of the memory cell array 101b along a boundary between the memory cell arrays 101b and 101c in order to be connected to a connection wiring 131.

In other words, a pair of connection points is on each bit line 105 and is across the boundary between the memory cell arrays 101a and 101b or across the boundary between the memory cell arrays 101c and 101d. One connection point is on each word line 104 and on the edge of the memory cell array 101d along the boundary between the memory cell arrays 101a and 101d or on the edge of the memory cell array 101b along the boundary between the memory cell arrays 101b and 101c.

Each bit line 105 is divided into two lines. One of the two lines is electrically connected to the first reading circuit 115a through the connection wirings 131 and the connection points 109 in the memory cell arrays 101a and 101b, and the other is electrically connected to the second reading circuit 115b through the connection wirings 131 and the connection points 109 in the memory cell arrays 101c and 101d. The purpose of dividing each bit line 105 in two is to reduce parasitic capacitance; the detail is described below.

<Parasitic Resistance>

The connection point 109 at which the bit line 105 is connected to the connection wiring 131 and the connection point 109 at which the word line 104 is connected to the connection wiring 131 are on the edge(s) along the boundary between two memory cell arrays. This reduces each of the parasitic resistances of the bit line 105 and the word line 104 to half in comparison with the case where the connection points 109 are on the periphery of a set of two memory cell arrays.

Arrows 151a to 151d illustrated in FIG. 1A show the directions of transmission of signals in data writing in the first to fourth sub-modules 141a to 141d, respectively.

Figure 5:
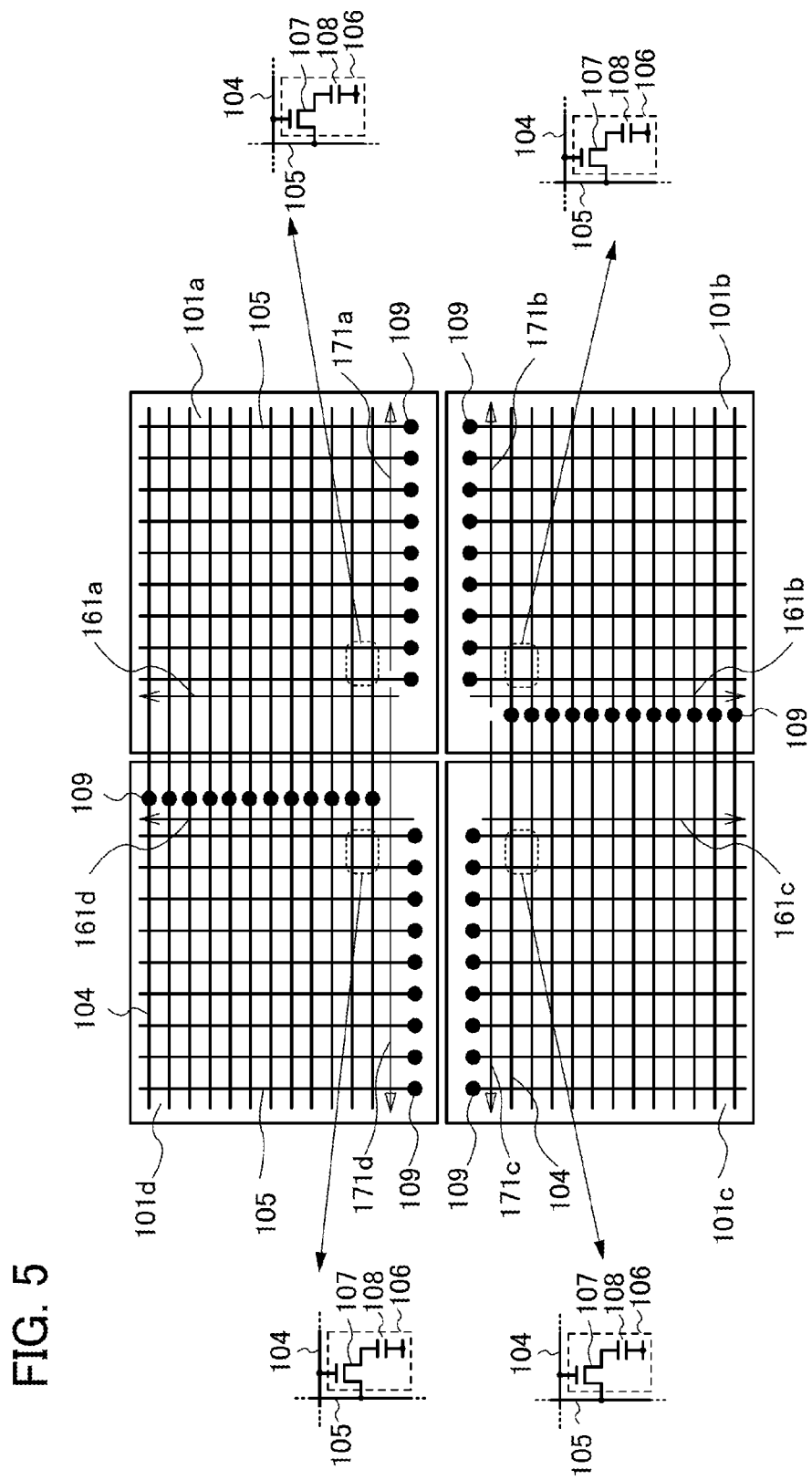
FIG. 5 is a top view of a memory device.

FIG. 5 shows the orientations of the memory cells 106 that are in the memory cell arrays 101a to 101d and are adjacent to the intersections of the bit lines 105 and the word lines 104.

As shown in FIG. 1B and FIG. 5, the oxide semiconductor transistors 107 of the all memory cells 106 in the memory cell arrays 101a to 101d are provided in the same direction as each other.

Figure 6:
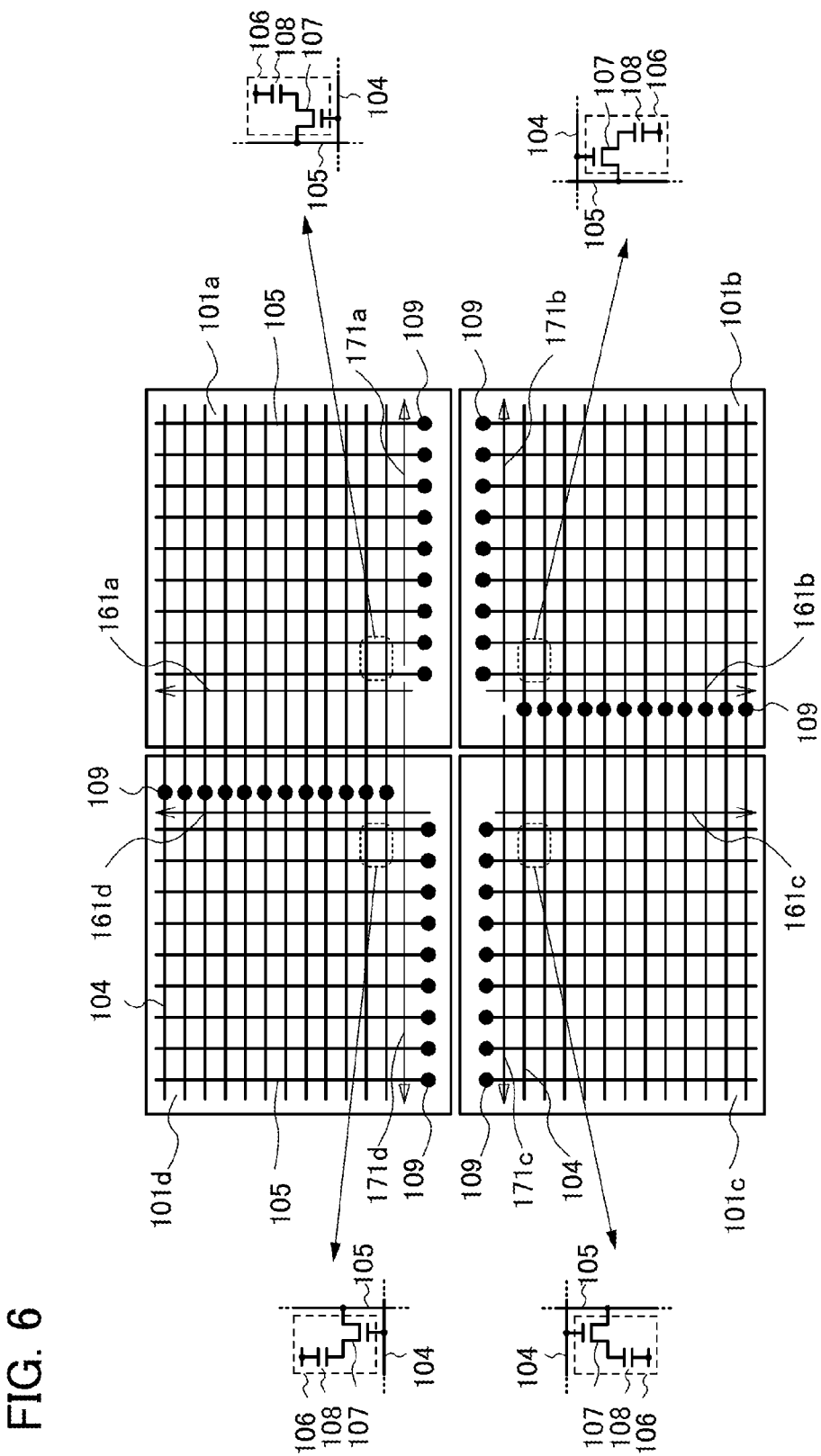
FIG. 6 is a top view of a memory device.

FIG. 6 shows another example of the orientations of the memory cells 106.

As shown in FIG. 1B and FIG. 6, the oxide semiconductor transistor 107 of the memory cell 106 in the memory cell array 101a and the oxide semiconductor transistor 107 of the memory cell 106 in the memory cell array 101b are provided to be line-symmetric with respect to a line connecting the connection points 109 in the memory cell array 101a.

The oxide semiconductor transistor 107 of the memory cell 106 in the memory cell array 101c and the oxide semiconductor transistor 107 of the memory cell 106 in the memory cell array 101d are provided to be line-symmetric with respect to a line connecting the connection points 109 in the memory cell array 101c.

The oxide semiconductor transistor 107 of the memory cell 106 in the memory cell array 101a and the oxide semiconductor transistor 107 of the memory cell 106 in the memory cell array 101d are provided to be line-symmetric with respect to a line connecting the connection points 109 in the memory cell array 101d.

The oxide semiconductor transistor 107 of the memory cell 106 in the memory cell array 101b and the oxide semiconductor transistor 107 of the memory cell 106 in the memory cell array 101c are provided to be line-symmetric with respect to a line connecting the connection points 109 in the memory cell array 101b.

The oxide semiconductor transistor 107 of the memory cell 106 in the memory cell array 101a and the oxide semiconductor transistor 107 of the memory cell 106 in the memory cell array 101c are provided to be centrally symmetric with respect to the center of the memory cell arrays 101a to 101d. In this embodiment, the center of the memory cell arrays 101a to 101d means a point from which the memory cell arrays 101a to 101d are equidistant.

The oxide semiconductor transistor 107 of the memory cell 106 in the memory cell array 101b and the oxide semiconductor transistor 107 of the memory cell 106 in the memory cell array 101d are provided to be centrally symmetric with respect to the center of the memory cell arrays 101a to 101d.

A signal that is transmitted across the first sub-module 141a in the direction shown by the arrow 151a in data writing is transmitted to the memory cell arrays 101a and 101b through the connection wirings 131 and the connection points 109. In the memory cell array 101a, the signal is transmitted in the direction shown by an arrow 161a. In the memory cell array 101b, the signal is transmitted in the direction shown by an arrow 161b.

A signal that is transmitted across the second sub-module 141b in the direction shown by the arrow 151b in data writing is transmitted to the memory cell arrays 101b and 101c through the connection wirings 131 and the connection points 109. In the memory cell array 101b, the signal is transmitted in the direction shown by an arrow 171b. In the memory cell array 101c, the signal is transmitted in the direction shown by an arrow 171c.

A signal that is transmitted across the third sub-module 141c in the direction shown by the arrow 151c in data writing is transmitted to the memory cell arrays 101c and 101d through the connection wirings 131 and the connection points 109. In the memory cell array 101c, the signal is transmitted in the direction shown by an arrow 161c. In the memory cell array 101d, the signal is transmitted in the direction shown by an arrow 161d.

A signal that is transmitted across the fourth sub-module 141d in the direction shown by the arrow 151d in data writing is transmitted to the memory cell arrays 101d and 101a through the connection wirings 131 and the connection points 109. In the memory cell array 101d, the signal is transmitted in the direction shown by an arrow 171d. In the memory cell array 101a, the signal is transmitted in the direction shown by an arrow 171a.

When a signal stored in the memory cell 106 is read, the signal is transmitted in a direction opposite to the direction shown by the arrows.

As described above, the first input/output circuit 111a and the first bit line driver circuit 112a, which includes the first decoder 113a, the first selector 114a, and the first reading circuit 115a, of the first sub-module 141a are provided to transmit a signal in the above direction in data writing. In addition, the connection wirings 131 in the first sub-module 141a are provided for the last region to which the signal is transmitted. The connection wirings 131 are electrically connected to the bit lines 105 of the memory cell arrays 101a and 101b through the connection points 109 in the memory cell arrays 101a and 101b. The connection points 109 in the memory cell arrays 101a and 101b are on the edge along the boundary between the memory cell arrays 101a and 101b. The signal is transmitted through the connection wirings 131 and the connection points 109, and is transmitted through the bit lines 105 of the memory cell array 101a in the direction shown by the arrow 161a and through the bit lines 105 of the memory cell array 101b in the direction shown by the arrow 161b.

The first word line driver circuit 121a, which includes the second decoder 122a, the first level shifter 123a, and the first buffer 124a, of the second sub-module 141b is provided to transmit a signal in the above direction in data writing. In addition, the connection wirings 131 in the second sub-module 141b are provided for the last region to which the signal is transmitted. The connection wirings 131 are electrically connected to the word lines 104 of the memory cell arrays 101b and 101c through the connection points 109 in the memory cell array 101b. The connection points 109 in the memory cell array 101b are on the edge along the boundary between the memory cell arrays 101c and 101d. The signal is transmitted through the connection wirings 131 and the connection points 109, and is transmitted through the word lines 104 of the memory cell array 101b in the direction shown by the arrow 171b and through the word lines 104 of the memory cell array 101c in the direction shown by the arrow 171c.

As described above, the second input/output circuit 111b and the second bit line driver circuit 112b, which includes the third decoder 113b, the second selector 114b, and the second reading circuit 115b, of the third sub-module 141c are provided to transmit a signal in the above direction in data writing. In addition, the connection wirings 131 in the third sub-module 141c are provided for the last region to which the signal is transmitted. The connection wirings 131 are electrically connected to the bit lines 105 of the memory cell arrays 101c and 101d through the connection points 109 in the memory cell arrays 101c and 101d. The connection points 109 in the memory cell arrays 101c and 101d are on the edge along the boundary between the memory cell arrays 101c and 101d. The signal is transmitted through the connection wirings 131 and the connection points 109, and is transmitted through the bit lines 105 of the memory cell array 101c in the direction shown by the arrow 161c and through the bit lines 105 of the memory cell array 101d in the direction shown by the arrow 161d.

The second word line driver circuit 121*b*, which includes the fourth decoder 122*b*, the second level shifter 123*b*, and the second buffer 124*b*, of the fourth sub-module 141*d* is provided to transmit a signal in the above direction in data writing. In addition, the connection wirings 131 in the fourth sub-module 141*d* are provided for the last region to which the signal is transmitted. The connection wirings 131 are electrically connected to the word lines 104 of the memory cell arrays 101*d* and 101*a* through the connection points 109 in the memory cell array 101*d*. The connection points 109 in the memory cell array 101*d* are on the edge along the boundary between the memory cell arrays 101*d* and 101*a*. The signal is transmitted through the connection wirings 131 and the connection points 109, and is transmitted through the word lines 104 of the memory cell array 101*a* in the direction shown by the arrow 171*a* and through the word lines 104 of the memory cell array 101*d* in the direction shown by the arrow 171*d*.

The circuits in the first to fourth sub-modules 141*a* to 141*d* and the connection points 109 in the memory cell arrays 101*a* to 101*d* are provided so that the parasitic resistances of the bit lines 105, the word lines 104, and the connection wirings 131 have minimum values.

According to this embodiment, a memory device can thus have low parasitic resistances of the bit line 105, the word line 104, and the connection wiring 131.

FIG. 2 shows a block diagram of a memory device in which the connection point 109 is on the periphery of a memory cell array. DRAM that is a memory device 300 illustrated in FIG. 2 includes a memory cell array 301, an input/output circuit 311, a bit line driver circuit 312, and a word line driver circuit 321. The bit line driver circuit 312 includes a decoder 313, a selector 314, and an amplifier circuit 315. The word line driver circuit 321 includes a decoder 322, a level shifter 323, and a buffer 324.

The memory cell array 301 is formed by dimensional arrangement of the plurality of memory cells 106. The memory cell 106 includes the oxide semiconductor transistor 107 and the storage capacitor 108. The oxide semiconductor transistor 107 is a switching element. One of the source and the drain of the oxide semiconductor transistor 107 is electrically connected to the bit line 105. The gate of the oxide semiconductor transistor 107 is electrically connected to the word line 104. The other of the source and the drain of the oxide semiconductor transistor 107 is connected to one terminal of the storage capacitor 108. The low power supply potential VSS (e.g., ground potential GND) is applied to the other terminal of the storage capacitor 108.

In the memory cell array 301, the memory cells 106 in each column share one bit line 105, and the memory cells 106 in each row share one word line 104.

The plurality of bit lines 105 in the memory cell array 301 are electrically connected to the bit line driver circuit 312, and the plurality of word lines 104 in the memory cell array 301 are electrically connected to the word line driver circuit 321. Connection points at which the bit lines 105 are connected to the bit line driver circuit 312 and connection points at which the word lines 104 are connected to the word line driver circuit 321 are the connection points 109.

As illustrated in FIG. 2, the connection point 109 is on the periphery of the memory cell array 301, which results in an increase in the parasitic resistances of the bit line 105 and the word line 104.

Figure 7:
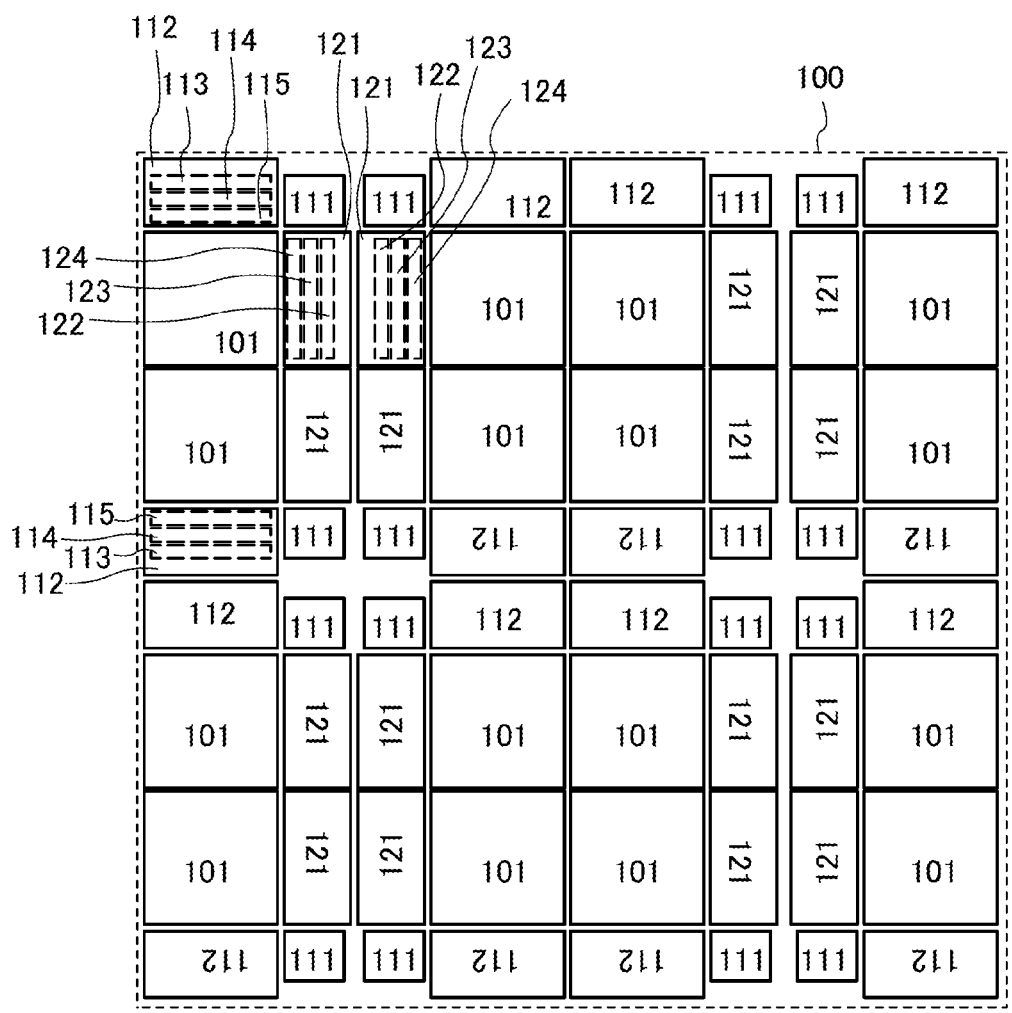
FIG. 7 is a top view of a memory device.

FIG. 7 is a block diagram of a memory device formed using sub-modules that is formed by dividing driver circuits and the memory cell array 301 of the memory device 300 illustrated in FIG. 2. A memory device formed using the sub-modules achieves a shorter time for applying a signal to each memory cell.

A memory device 100 illustrated in FIG. 7 is formed by dividing circuits in the memory device 300 illustrated in FIG. 2 into sixteen and rearranging them.

The memory device 100 illustrated in FIG. 7 includes sixteen memory cell arrays 101, sixteen input/output circuits 111, sixteen bit line driver circuits 112, and sixteen word line driver circuits 121. Each of the bit line driver circuits 112 includes the decoder 113, the selector 114, and the reading circuit 115. Each of the word line driver circuits 121 includes the decoder 122, the level shifter 123, and the buffer 124.

The memory cell array 101 includes dimensionally arranged memory cells 106, similarly to the memory cell array 301 in FIG. 2. Each of the memory cells 106 of the memory cell array 101 in FIG. 7 has a structure similar to that shown in FIGS. 1A to 1C.

The sixteen memory cell arrays 101 of the memory device 100 illustrated in FIG. 7 is formed by dividing the memory cell array 301 of the memory device 300 illustrated in FIG. 2 into sixteen. The memory device 100 illustrated in FIG. 7 also has input/output circuits, bit line driver circuits, and word line driver circuits that are formed by dividing the input/output circuit, the bit line driver circuit, and the word line driver circuit illustrated in FIG. 2 into sixteen in accordance with dividing of the memory cell array in FIG. 2 into sixteen. The memory device 100 illustrated in FIG. 7 has the sixteen memory cell arrays 101, the sixteen input/output circuits 111, the sixteen bit line driver circuits 112, and the sixteen word line driver circuits 121. The number into which the memory device is divided can be changed as necessary; for example, the memory device may be divided into sixty four.

In FIG. 7, the orientations of reference numerals show the orientations of circuits. FIGS. 8A to 8E each show a relation between the orientation of a reference numeral and the orientation of a circuit.

Figure 8A:
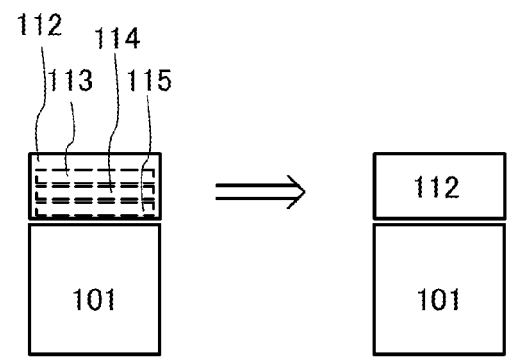
FIGS. 8A to 8E are top views of a memory device.
Figure 8B:
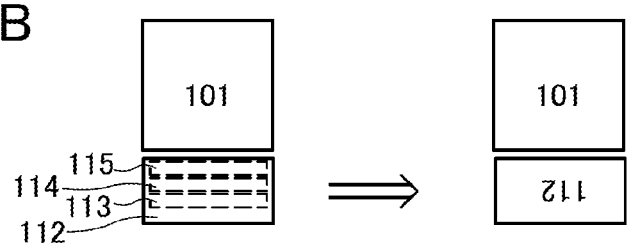

FIGS. 8A and 8B each show the orientation of the bit line driver circuit 112. The bit line driver circuit 112 illustrated in FIG. 8A is provided on the top of the memory cell array 101. As illustrated in FIG. 8A, the orientation of "112" is normal in the case where the decoder 113, the selector 114, and the reading circuit 115 are provided in the bit line driver circuit 112 in this order from the top to the bottom.

The bit line driver circuit 112 illustrated in FIG. 8B is on the lower side of the memory cell array 101. As illustrated in FIG. 8B, the orientation of "112" is upside down in the case where the decoder 113, the selector 114, and the reading circuit 115 are provided in the bit line driver circuit 112 in this order from the bottom to the top, that is, the reading circuit 115, the selector 114, and the decoder 113 are provided in the bit line driver circuit 112 in this order from the top to the bottom.

In any of FIGS. 8A and 8B, the reading circuit 115 is the closest to the memory cell array 101 among the decoder 113, the selector 114, and the reading circuit 115 in the bit line driver circuit 112.

Figure 8C:
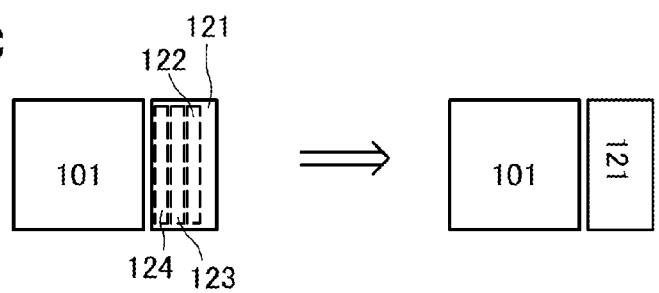
Figure 8D:
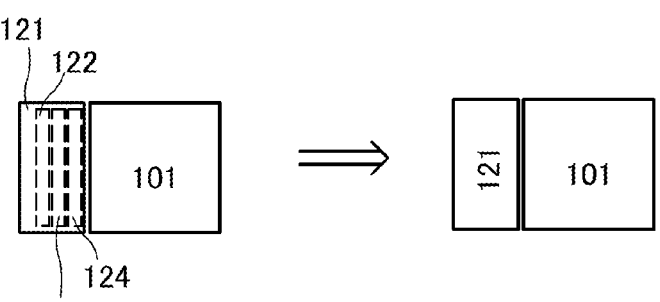

FIGS. 8C and 8D each show the orientation of the word line driver circuit 121. The word line driver circuit 121 illustrated in FIG. 8C is on the right side of the memory cell array 101. As illustrated in FIG. 8C, the orientation of "121" is rotated by 90° toward the right in the case where the decoder 122, the level shifter 123, and the buffer 124 are provided in the word line driver circuit 121 in this order from the right to the left.

The word line driver circuit 121 illustrated in FIG. 8D is on the left side of the memory cell array 101. As illustrated in FIG. 8D, the orientation of "121" is rotated by 90° toward the left in the case where the decoder 122, the level shifter 123, and the buffer 124 are provided in the word line driver circuit 121 in this order from the left to the right, that is, the buffer 124, the level shifter 123, and the decoder 122 are provided in the word line driver circuit 121 in this order from the right to the left.

In any of FIGS. 8C and 8D, the buffer 124 is the closest to the memory cell array 101 among the decoder 122, the level shifter 123, and the buffer 124 in the word line driver circuit 121.

Figure 8E:
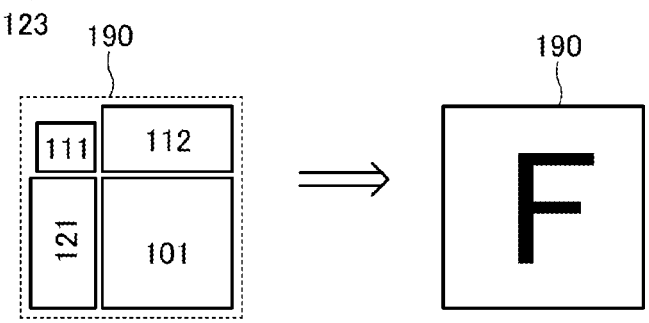

A set of the input/output circuit 111, the bit line driver circuit 112, the word line driver circuit 121, and the memory cell array 101 is referred to as a circuit 190, as illustrated in FIG. 8E. As shown in FIG. 8E, the circuit 190 having the following structure is illustrated by "F" enclosed in a square: the bit line driver circuit 112 is on the top of the memory cell array 101, the word line driver circuit 121 is on the left of the memory cell array 101, and the input/output circuit 111 is on the upper left of the memory cell array, the left of the bit line driver circuit 112, and the top of the word line driver circuit 121.

Figure 9:
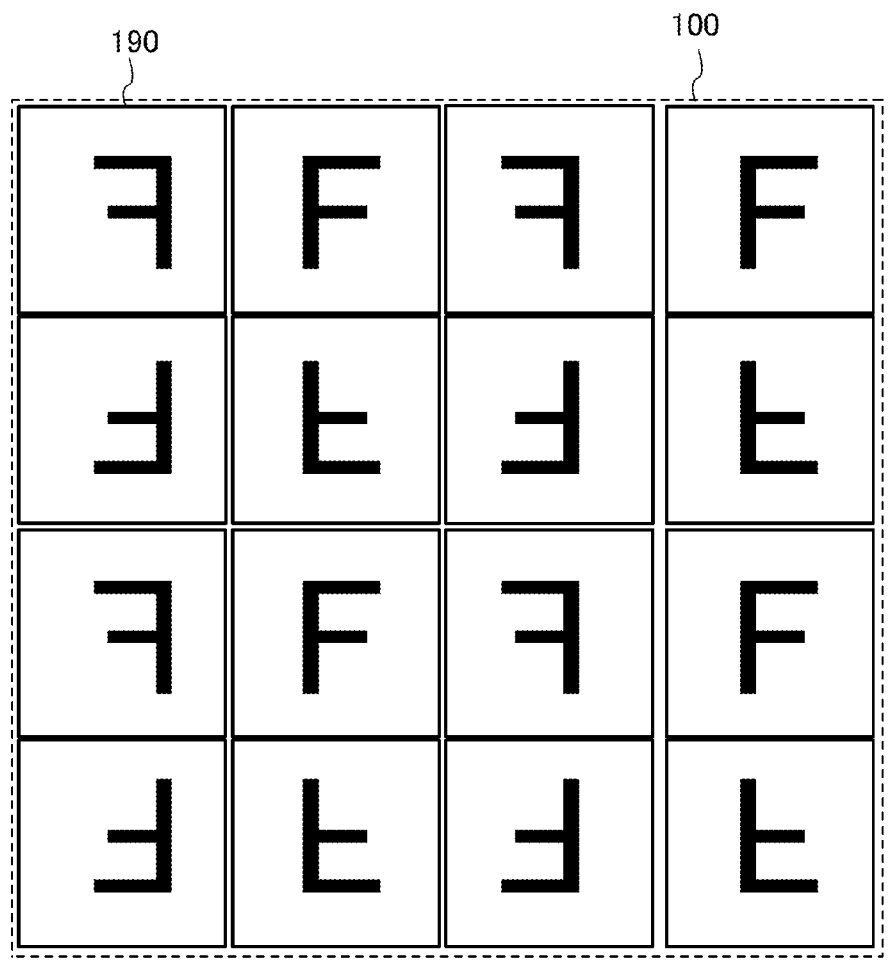
FIG. 9 is a top view of a memory device.

FIG. 9 illustrates the memory device 100 that is illustrated in FIG. 7 and is represented by the circuits 190 that are each shown by "F" enclosed in a square as illustrated in FIG. 8E.

As shown in FIG. 9, the circuits 190 adjacent to each other are line-symmetric with respect to a line between the circuits 190.

Driver circuits and the memory cell array 301 of the memory device 300 illustrated in FIG. 2 are divided to form a memory device formed using the sub-modules as shown in FIG. 7 and FIG. 9, which results in a shorter time for applying a signal to each memory cell.

Note that in the memory device formed using the sub-modules of the memory cell array and the driver circuit, which are shown in FIG. 7 and FIG. 9, a connection point at which the bit line and the bit line driver circuit are connected and a connection point at which the word line and the word line driver circuit are connected are on the periphery of the memory cell array.

When a memory device is formed using the sub-modules of a memory cell array and a driver circuit, areas of the memory cell array and the driver circuit are increased, which is a problem.

Figure 10:
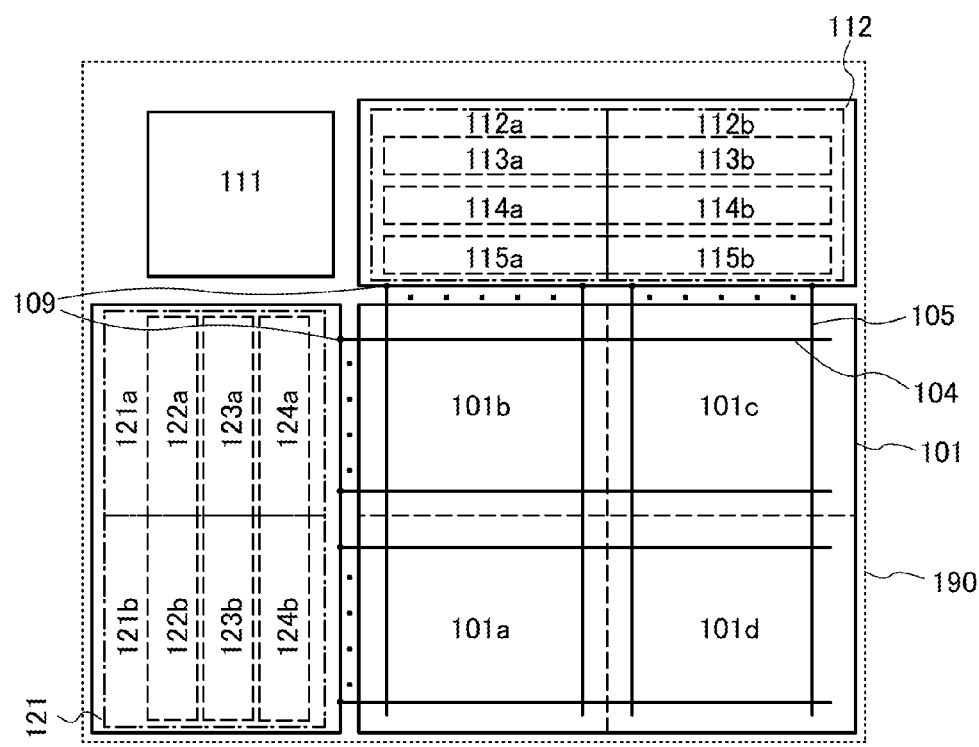
FIG. 10 is a top view of a memory device.

FIG. 10 shows the locations of the bit line 105, the word line 104, and the connection points 109 in the circuit 190.

In the circuit 190 illustrated in FIG. 10, the connection points 109 at which the bit line 105 and the bit line driver circuit 112 are connected and at which the word line 104 and the word line driver circuit 121 are connected are on the periphery of the memory cell array 101. Therefore, the parasitic resistances of the word line 104 and the bit line 105 thus become high.

A memory device formed of sub-modules has an advantage of shorter time for applying a signal to each memory cell, while the word line 104 and the bit line 105 have high parasitic resistance when the connection points at which the bit line and the bit line driver circuit are connected and at which the word line and the word line driver circuit are connected are on the ends of the bit line and the word line (on the periphery of the memory cell array).

A memory device can have lower parasitic resistances of a bit line, a word line, and connection wirings, like the memory device of this embodiment illustrated in FIGS. 1A to 1C, in such a manner that a driver circuit and a memory cell array are divided to form sub-modules, and a connection point at which a bit line and a connection wiring are connected and a connection point at which a word line and a connection wiring are connected are provided on the edges along the boundary between two memory cell arrays.

The memory device illustrated in FIGS. 1A to 1C has a smaller area because the driver circuit and at least part of the memory cell array are stacked.

The process to form the memory device illustrated in FIGS. 1A to 1C on the basis of the memory device 100 illustrated in FIG. 7 and FIG. 9 is described below.

In the circuit 190 illustrated in FIG. 10, the bit line driver circuit 112 is divided into the first bit line driver circuit 112a and the second bit line driver circuit 112b, and the word line driver circuit 121 is divided into the first word line driver circuit 121a and the second word line driver circuit 121b. The first bit line driver circuit 112a includes the first decoder 113a, the first selector 114a, and the first reading circuit 115a. The second bit line driver circuit 112b includes the third decoder 113b, the second selector 114b, and the second reading circuit 115b. The first word line driver circuit 121a includes the second decoder 122a, the first level shifter 123a, and the first buffer 124a. The second word line driver circuit 121b includes the fourth decoder 122b, the second level shifter 123b, and the second buffer 124b.

In the circuit 190 illustrated in FIG. 10, the memory cell array 101 is divided into the memory cell arrays 101a to 101d.

The memory cell array 101a is driven by the first bit line driver circuit 112a and the second word line driver circuit 121b. The memory cell array 101b is driven by the first bit line driver circuit 112a and the first word line driver circuit 121a. The memory cell array 101c is driven by the second bit line driver circuit 112b and the first word line driver circuit 121a. The memory cell array 101d is driven by the second bit line driver circuit 112b and the second word line driver circuit 121b.

Figure 11A:
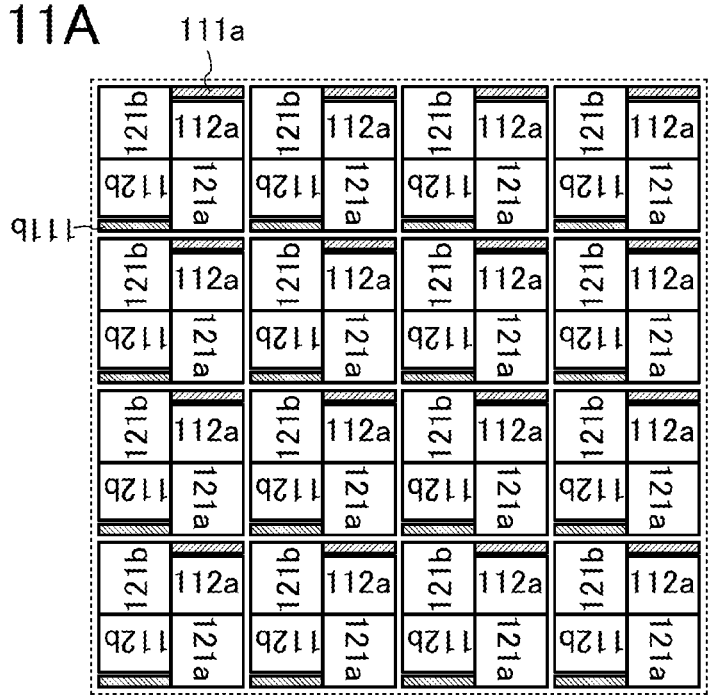
FIGS. 11A and 11B are top views of a memory device.

In FIG. 11A, the first bit line driver circuit 112a and the second bit line driver circuit 112b are provided to be centrally symmetric with respect to the center of the first bit line driver circuit 112a, the second bit line driver circuit 112b, the first word line driver circuit 121a, and the second word line driver circuit 121b. The center of the first bit line driver circuit 112a, the second bit line driver circuit 112b, the first word line driver circuit 121a, and the second word line driver circuit 121b means a point from which the first bit line driver circuit 112a, the second bit line driver circuit 112b, the first word line driver circuit 121a, and the second word line driver circuit 121b are equidistant. Similarly, the first word line driver circuit 121a and the second word line driver circuit 121b are provided to be centrally symmetric with respect to the above-described center. The first bit line driver circuit 112a is adjacent to the first word line driver circuit 121a and the second word line driver circuit 121b, the first word line driver circuit 121a is adjacent to the first bit line driver circuit 112a and the second bit line driver circuit 112b, the second bit line driver circuit 112b is adjacent to the first word line driver circuit 121a and the second word line driver circuit 121b, and the second word line driver circuit 121b is adjacent to the first bit line driver circuit 112a and the second bit line driver circuit 112b.

Figure 11B:
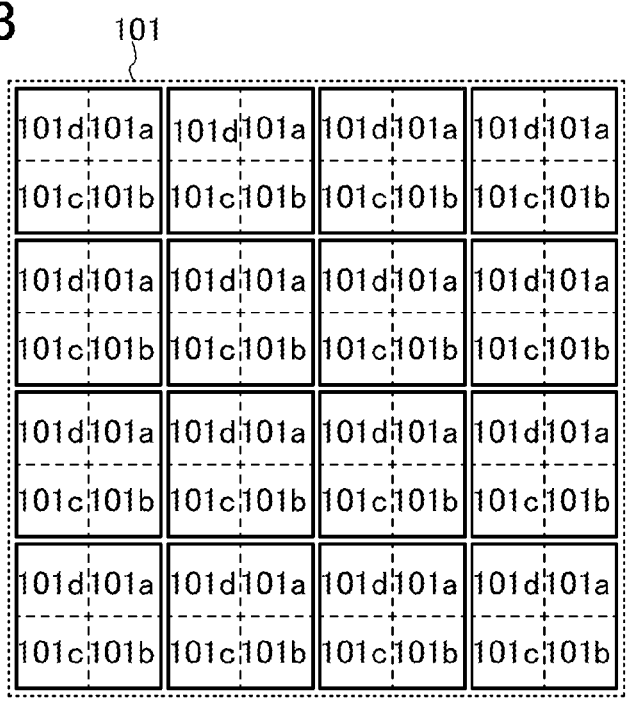

The memory cell arrays 101a to 101d are each provided to overlap with one of the first bit line driver circuit 112a, the second bit line driver circuit 112b, the first word line driver circuit 121a, and the second word line driver circuit 121b (see FIG. 11B).

The first bit line driver circuit 112a, the second bit line driver circuit 112b, the first word line driver circuit 121a, and the second word line driver circuit 121b illustrated in FIG. 11A are electrically connected to the memory cell arrays 101a to 101d illustrated in FIG. 11B through connection points provided on an edge along each boundary between memory cell arrays, by using connection wirings, similarly to the memory device illustrated in FIGS. 1A to 1C.

In the above manner, a memory device that has lower parasitic resistances of a bit line and a word line can be provided according to this embodiment.

In the memory device of this embodiment, low parasitic resistances of a bit line and a word line make it possible to reduce wire delay According to this embodiment, a memory device having a memory region with smaller area can be obtained.

<Parasitic Capacitance>

As described above, the memory cell 106 includes the oxide semiconductor transistor 107 and the storage capacitor 108 one terminal of which is electrically connected to the other of the source and the drain of the oxide semiconductor transistor 107. The low power supply potential VSS (e.g., ground potential GND) is applied to the other terminal of the storage capacitor 108. One of the source and the drain of the oxide semiconductor transistor 107 is electrically connected to the bit line 105. The gate of the oxide semiconductor transistor 107 is electrically connected to the word line 104 (see FIG. 3A).

Parasitic capacitance is generated between the bit line 105 and another electrode or wiring. For example, parasitic capacitance is generated between the bit line 105 and a node that connects the other of the source and the drain of the oxide semiconductor transistor 107 and one terminal of the storage capacitor 108, or between the bit line 105 and the other terminal of the storage capacitor 108.

Figure 3B:
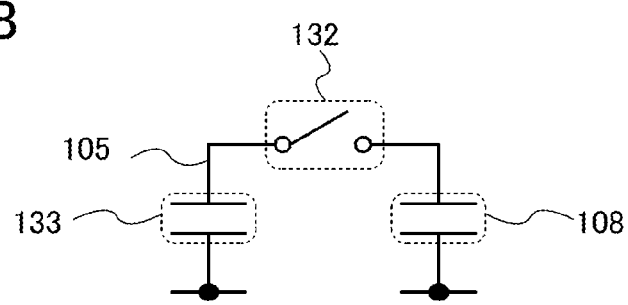

The whole parasitic capacitance between the bit line 105 and another electrode or wiring is referred to as parasitic capacitance 133. FIG. 3B illustrates the parasitic capacitance 133, a switching element 132 which is the oxide semiconductor transistor 107, and the storage capacitor 108.

For reading operation, first, a voltage of half a high power supply potential ($\frac{1}{2} \times VDD$) is applied to the bit line 105 while the switching element 132 is in an off state (see FIG. 3C), which is referred to as $\frac{1}{2}(VDD)$ precharge.

Here, $Qb = Cb \times \frac{1}{2} \times (VDD)$ is satisfied when the capacitance value of the storage capacitor 108 is a capacitance value Cs, the capacitance value of the parasitic capacitance 133 is a capacitance value Cb, electric charge in the storage capacitor 108 is electric charge Qs, and electric charge in the parasitic capacitance 133 is electric charge Qb. In addition, $Qs = Cs \times VDD$ is satisfied when the storage capacitor 108 has already stored electric charge, and $Qs = 0$ is satisfied when the storage capacitor 108 has not stored electric charge.

Figure 3C:
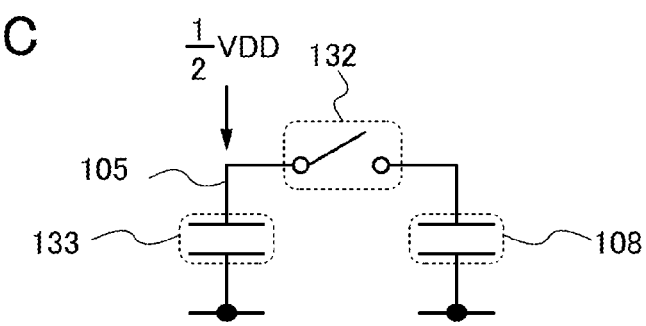
Figure 3D:
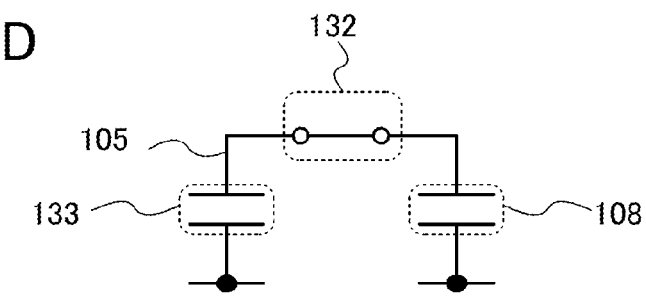

Then, the word line 104 of the memory cell 106 is selected to apply the high power supply potential VDD to the gate of the oxide semiconductor transistor 107, which is the switching element 132, so that the switching element 132 is turned on (see FIG. 3D).

When the switching element 132 is turned on, a voltage applied to the storage capacitor 108 becomes equivalent to a voltage applied to the parasitic capacitance 133. In the case where the voltages are each a voltage Vb, $Vb = \frac{1}{2} \times VDD \times ((Cb+2Cs)/(Cb+Cs))$ is satisfied when the storage capacitor 108 has already stored electric charge, and $Vb = \frac{1}{2} \times VDD \times (Cb/(Cb+Cs))$ is satisfied when the storage capacitor 108 has not stored electric charge.

In the case where a difference between the voltage Vb and ($\frac{1}{2} \times VDD$), which is applied first, is a voltage change $\Delta Vb$, $\Delta Vb = \frac{1}{2} \times VDD \times (Cs/(Cb+Cs))$ is satisfied when the storage capacitor 108 has already stored electric charge, and $\Delta Vb = -\frac{1}{2} \times VDD \times (Cs/(Cb+Cs))$ is satisfied when the storage capacitor 108 has not stored electric charge.

The $\frac{1}{2}(VDD)$ precharge is performed and then the switching element 132 is turned on as described above, whereby a voltage applied to the bit line 105 changes by the voltage change $\Delta Vb$. The voltage change $\Delta Vb$ is amplified by an amplifying element (e.g., sense amplifier) connected to the bit line 105. The amplified voltage change $\Delta Vb$ is output as feedback and a reading signal.

When the voltage change $\Delta Vb$ is too small, it is possible that the voltage change $\Delta Vb$ be not able to be amplified with an amplifier element. In such a case, data stored in the memory cell 106 cannot be read in some cases. Accordingly, it is necessary to set the voltage change $\Delta Vb$ so that it can be amplified with an amplifier element. As described above, the voltage change $\Delta Vb$ is a function of the capacitance value Cs of the storage capacitor 108 and the capacitance value Cb of the parasitic capacitance 133. Therefore, the capacitance value Cs of the storage capacitor 108 is controlled to control the voltage change $\Delta Vb$. When the voltage change $\Delta Vb$ is capable of being amplified with the amplifier element, the capacitance value Cs of the storage capacitor 108 is preferably 20 fF or more and 30 fF or less.

The switching element 132, which is used as the oxide semiconductor transistor 107 in the memory cell 106 of this embodiment, has extremely low leakage current in an off state. Accordingly, the capacitance value Cs of the storage capacitor 108 in the memory cell 106 can be markedly reduced when determined in view of the amount of electric charge retained for a certain period.

The storage capacitor 108 needs to have a capacitance value Cs larger than or equal to a certain value in reading data from the memory cell 106, while it is possible to form the storage capacitor 108 having an extremely small capacitance value Cs.

Note that the storage capacitor 108 with a large capacitance value Cs needs a large area, a complicated manufacturing process, and the like, which is disadvantageous.

In addition, an increase in the number of the memory cells 106 electrically connected to one bit line 105 leads to an increase in parasitic capacitance 133 of the whole of the bit line 105. When the capacitance value Cb of the parasitic capacitance 133 of the bit lines 105 is increased, the voltage change $\Delta Vb$ decreases as shown in the formula for the voltage change $\Delta Vb$, which results in greater difficulty in reading data from the memory cell 106.

For the above reasons, in the memory device of this embodiment, the storage capacitor 108 needs to have a capacitance value Cs larger than or equal to a certain value, and the capacitance value Cb of the parasitic capacitance 133 is preferably small.

Figure 4:
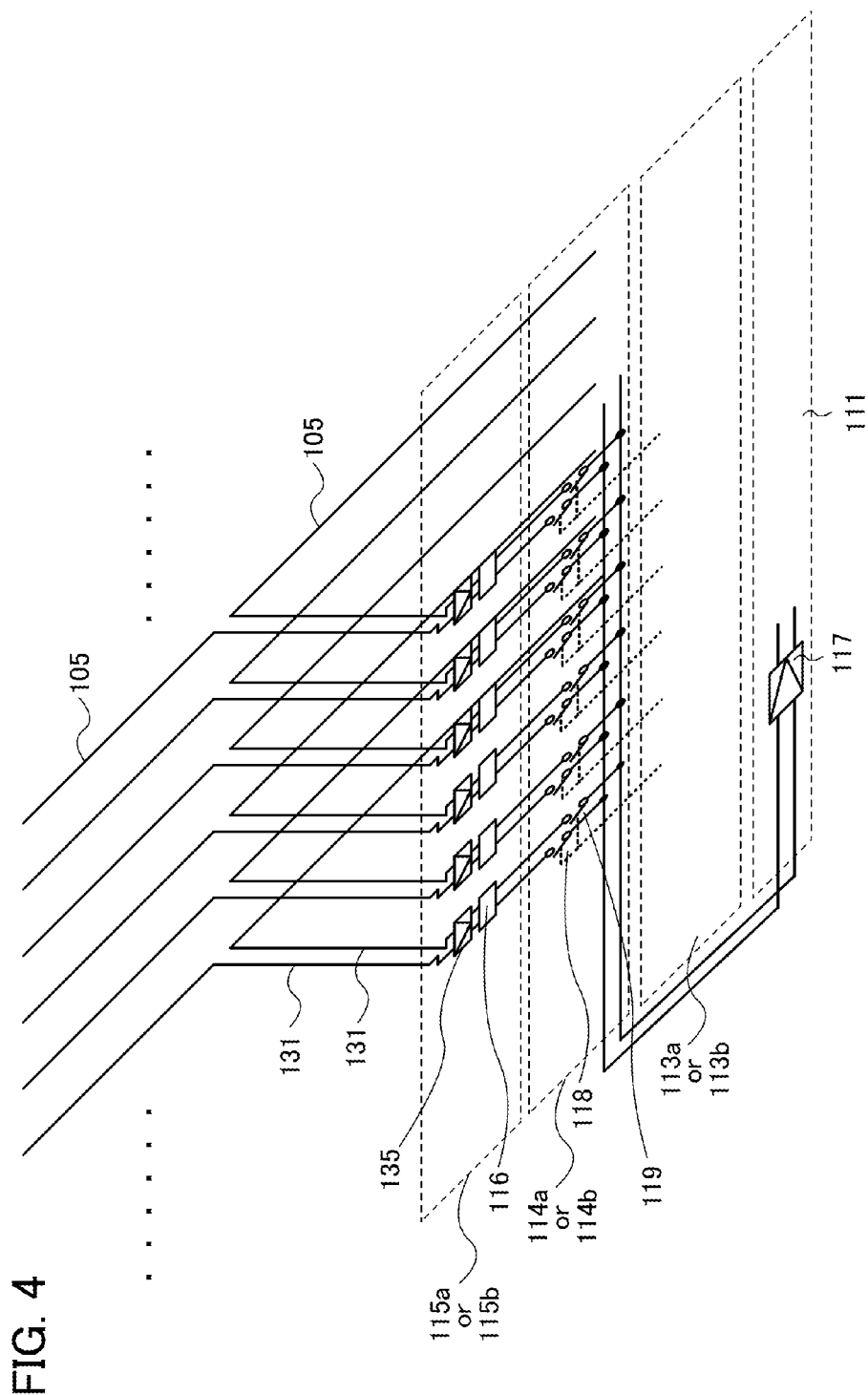
FIG. 4 is a perspective view of a memory device.

FIG. 4 shows the locations of an amplifying element 135, a precharge circuit 116, a first switch 118, a second switch 119, and a main amplifier 117. The amplifying element 135 is provided for each of the first reading circuit 115a and the second reading circuit 115b. The precharge circuit 116 is provided for each of the first reading circuit 115a and the second reading circuit 115b. The first switch 118 is provided for each of the first selector 114a and the second selector 114b. The second switch 119 is provided for each of the first selector 114a and the second selector 114b. The main amplifier 117 is provided for the input/output circuit 111. The amplifying element 135 amplifies a difference between a potential input to a first terminal of the amplifying element 135 and a potential input to a second terminal of the amplifying element 135. The precharge circuit 116 is configured to apply the voltage $\frac{1}{2}(VDD)$ to the bit line 105.

As illustrated in FIG. 4, one bit line 105 is divided into two lines, and the two lines are electrically connected to the connection wirings 131 through the connection points 109. The connection wirings 131 that are electrically connected to the bit line 105 which is divided into the two lines through the connection points 109 are electrically connected to the first terminal and the second terminal of the amplifying element 135.

Thus, one of the two lines has half the length of one bit line 105; accordingly, the capacitance value Cb of the parasitic capacitance 133 becomes half. When the voltage change ΔVb is fixed, cutting the capacitance value Cb of the parasitic capacitance 133 in half leads to a reduction to half the capacitance value Cs of the storage capacitor 108 in the memory cell 106.

A third terminal and a fourth terminal of the amplifying element 135 are electrically connected to a first terminal and a second terminal of the precharge circuit 116, respectively.

The first terminal and the second terminal of the precharge circuit 116 are electrically connected to the third terminal and the fourth terminal of the amplifying element 135, respectively. A third terminal of the precharge circuit 116 is electrically connected to one terminal of the first switch 118. A fourth terminal of the precharge circuit 116 is electrically connected to one terminal of the second switch 119.

The one terminal of the first switch 118 is electrically connected to the third terminal of the precharge circuit 116. The other terminal of the first switch 118 is electrically connected to a first terminal of the main amplifier 117.

The one terminal of the second switch 119 is electrically connected to the fourth terminal of the precharge circuit 116. The other terminal of the second switch 119 is electrically connected to a second terminal of the main amplifier 117.

Figure 17:
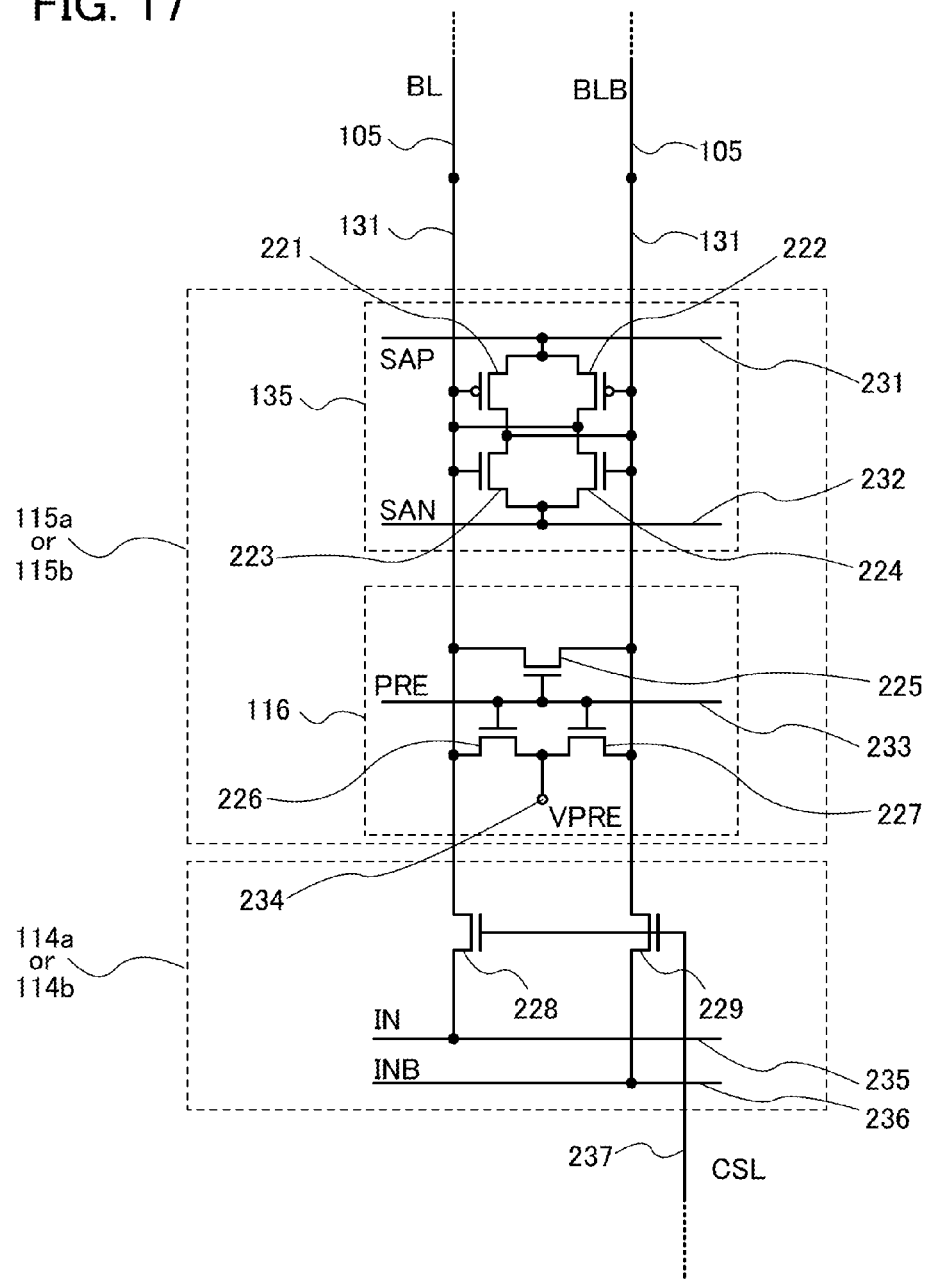
FIG. 17 illustrates a circuit configuration of a memory device.

FIG. 17 illustrates a more specific circuit configuration of the amplifying element 135, the precharge circuit 116, the first switch 118, and the second switch 119. In FIG. 17, one of the two lines of which are the divided bit line 105 and the connection wiring 131 connected thereto are referred to as a bit line BL, and the other of the two lines and the connection wiring 131 connected thereto are referred to as the a line BLB.

The amplifying element 135 includes a p-channel transistor 221, a p-channel transistor 222, an n-channel transistor 223, and an n-channel transistor 224.

One of a source and a drain of the p-channel transistor 221 is electrically connected to a wiring 231 for applying a power supply potential SAP of the amplifying element 135 and to one of a source and a drain of the p-channel transistor 222. The other of the source and the drain of the p-channel transistor 221 is electrically connected to one of a source and a drain of the n-channel transistor 223, the bit line BLB, a gate of the p-channel transistor 222, and a gate of the n-channel transistor 224. A gate of the p-channel transistor 221 is electrically connected to the bit line BL, the other of the source and the drain of the p-channel transistor 222, a gate of the n-channel transistor 223, and one of a source and a drain of the n-channel transistor 224.

One of the source and the drain of the p-channel transistor 222 is electrically connected to the wiring 231 for applying a power supply potential SAP of the amplifying element 135 and to one of the source and the drain of the p-channel transistor 221. The other of the source and the drain of the p-channel transistor 222 is electrically connected to the bit line BL, the gate of the p-channel transistor 221, the gate of the n-channel transistor 223, and one of the source and the drain of the n-channel transistor 224.

One of the source and the drain of the n-channel transistor 223 is electrically connected to the other of the source and the drain of the p-channel transistor 221, the bit line BLB, the gate of the p-channel transistor 222, and the gate of the n-channel transistor 224. The other of the source and the drain of the n-channel transistor 223 is electrically connected to the other of the source and the drain of the n-channel transistor 224 and a wiring 232 for applying a power supply potential SAN of the amplifying element 135. The gate of the n-channel transistor 223 is electrically connected to the gate of the p-channel transistor 221, the bit line BL, the other of the source and the drain of the p-channel transistor 222, and one of the source and the drain of the n-channel transistor 224.

One of the source and the drain of the n-channel transistor 224 is electrically connected to the gate of the p-channel transistor 221, the bit line BL, the other of the source and the drain of the p-channel transistor 222, and the gate of the n-channel transistor 223. The other of the source and the drain of the n-channel transistor 224 is electrically connected to the other of the source and the drain of the n-channel transistor 223 and the wiring 232 for applying a power supply potential SAN of the amplifying element 135. The gate of the n-channel transistor 224 is electrically connected to the bit line BLB, the other of the source and the drain of the p-channel transistor 221, the gate of the p-channel transistor 222, and one of the source and the drain of the n-channel transistor 223.

The precharge circuit 116 includes an n-channel transistor 225, an n-channel transistor 226, and an n-channel transistor 227.

One of a source and a drain of the n-channel transistor 225 is electrically connected to the bit line BL and one of a source and a drain of the n-channel transistor 226. The other of the source and the drain of the n-channel transistor 225 is electrically connected to the bit line BLB and one of a source and a drain of the n-channel transistor 227. A gate of the n-channel transistor 225 is electrically connected to a wiring 233 for applying a potential PRE, a gate of the n-channel transistor 226, and a gate of the n-channel transistor 227.

One of the source and the drain of the n-channel transistor 226 is electrically connected to the bit line BL and one of the source and the drain of the n-channel transistor 225. The other of the source and the drain of the n-channel transistor 226 is electrically connected to the other of the source and the drain of the n-channel transistor 227 and a terminal 234 for applying a potential VPRE. The gate of the n-channel transistor 226 is electrically connected to the wiring 233 for applying a potential PRE, the gate of the n-channel transistor 225, and the gate of the n-channel transistor 227.

One of the source and the drain of the n-channel transistor 227 is electrically connected to the bit line BLB and the other of the source and the drain of the n-channel transistor 225. The other of the source and the drain of the n-channel transistor 227 is electrically connected to the other of the source and the drain of the n-channel transistor 226 and the terminal 234 for applying a potential VPRE. The gate of the n-channel transistor 227 is electrically connected to the wiring 233 for applying a potential PRE, the gate of the n-channel transistor 225, and the gate of the n-channel transistor 226.

An n-channel transistor 228 and an n-channel transistor 229 are employed as the first switch 118 and the second switch 119 illustrated in FIG. 4, respectively.

One of a source and a drain of the n-channel transistor 228 is electrically connected to the bit line BL. The other of the source and the drain of the n-channel transistor 228 is electrically connected to a wiring 235 (also referred to as a wiring IN) that is electrically connected to the first terminal of the main amplifier 117. A gate of the n-channel transistor 228 is electrically connected to a wiring 237 and a gate of the n-channel transistor 229.

One of a source and a drain of the n-channel transistor 229 is electrically connected to the bit line BLB. The other of the source and the drain of the n-channel transistor 229 is electrically connected to a wiring 236 (also referred to as a wiring INB) that is electrically connected to the second terminal of the main amplifier 117. The gate of the n-channel transistor 229 is electrically connected to the wiring 237 and the gate of the n-channel transistor 228.

The wiring 237 (also referred to as a wiring CSL) is a wiring that is selected by the first decoder 113a or the third decoder 113b.

Figure 18:
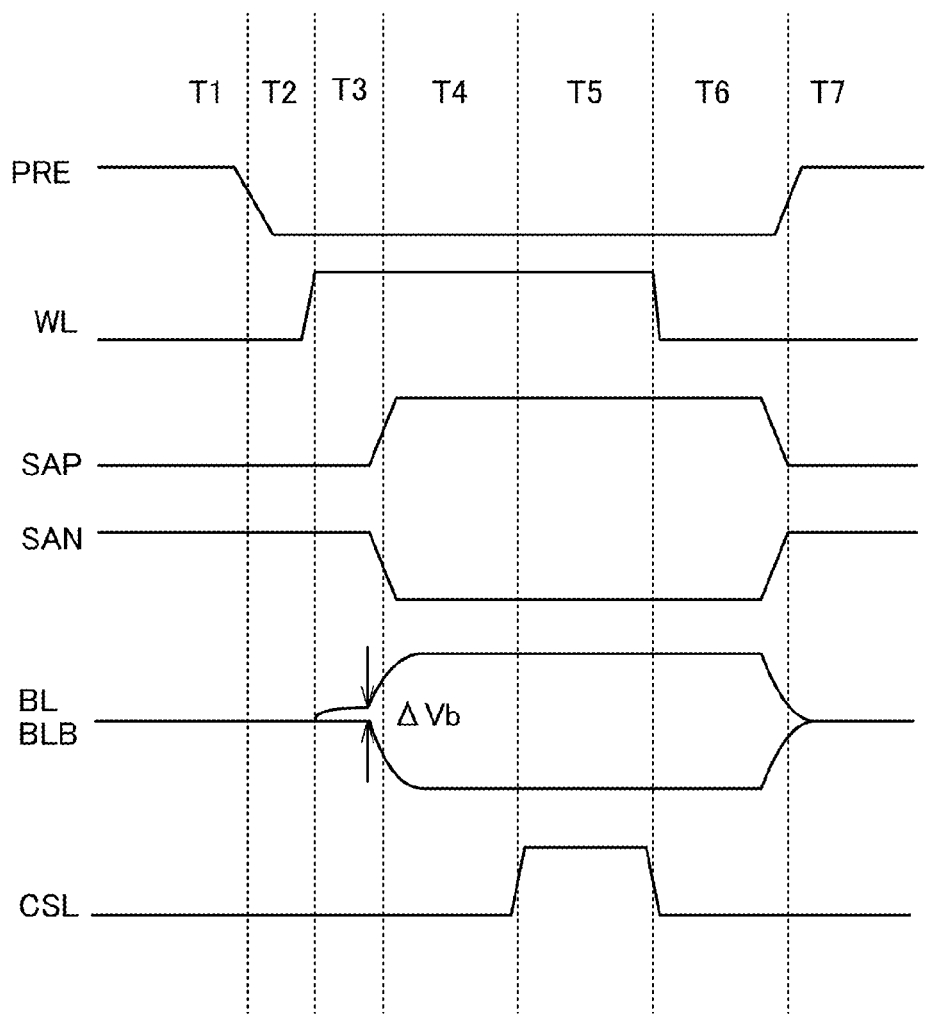
FIG. 18 is a timing diagram of a memory device.

FIG. 18 is a timing diagram of operation of the circuit illustrated in FIG. 4 and FIG. 17. In the timing diagram of FIG. 18, "PRE" represents a potential applied to the wiring 233: "WL" represents the potential of the word line 104; "SAP" represents a power supply potential of the amplifying element 135, which is applied to the wiring 231; "SAN" represents a power supply potential of the amplifying element 135, which is applied to the wiring 232; "BL" represents the potential of the bit line BL; "BLB" represents the potential of the bit line BLB; and "CSL" represents the potential of the wiring 237 selected by the first decoder 113a or the third decoder 113b. Note that between the curve lines showing the potential BL and the potential BLB, what the upper or lower curve line represents depends on which of the bit line BL and the bit line BLB is selected or which of a high-level potential and a low-level potential is held at the storage capacitor 108 in the memory cell 106 connected to a corresponding bit line. For example, when the potential that is held at the storage capacitor 108 in the memory cell 106 connected to the bit line BL is at high level, the potential BL is represented by the upper curve line and the potential BLB is represented by the lower curve line.

A period T1 is a non-selection period. In the period T1, a potential PRE is at high level; accordingly, the precharge circuit 116 works, and a potential VPRE that is ½(VDD) is input to the terminal 234. Therefore, the bit line BL and the bit line BLB are precharged. The state in the period T1 is shown in FIG. 3C.

In a period T2, the potential PRE is at low level; thus, a precharge period ends.

In a period T3, the potential WL of the word line 104 is at high level; accordingly, the oxide semiconductor transistor 107 in a target memory cell 106 is turned on. The potential of the bit line BL becomes equal to the potential held at the storage capacitor 108 in the target memory cell 106. The state in the period T3 is shown in FIG. 3D. In this case, the voltage change ΔVb of the potential of the bit line BL is determined by the ratio between the capacitance value Cs of the storage capacitor 108 and the capacitance value Cb of the parasitic capacitance 133 as described with reference to FIGS. 3A to 3D.

In a period T4, a power supply potential SAP and a power supply potential SAN of the amplifying element 135 are input; accordingly, amplification is performed so that one of the potential of the bit line BL and the potential of the bit line BLB becomes the high power supply potential VDD, and the other potential is decreased to the low power supply potential VSS. Thus, the potential held at the storage capacitor 108 in the memory cell 106 is increased.

In a period T5, the potential CSL of the wiring 237, which is selected by the first decoder 113a or the third decoder 113b, is at high level. Accordingly, the bit line BL and the bit line BLB that are connected to the selected wiring 237 are electrically connected to the wiring 235 (also referred to as the wiring IN) and the wiring 236 (also referred to as the wiring INB), respectively. Consequently, the potential that is held at the storage capacitor 108 in the memory cell 106 and increased in the period T4 is further increased by the main amplifier 117.

In the period T5, the potential WL of the word line 104 is still at high level; accordingly, the increased potential of the bit line BL or the bit line BLB is also written to the storage capacitor 108 in the memory cell 106.

In a period T6, the potential CSL of the wiring 237 and the potential WL of the word line 104 are at low level. Consequently, the potential written to the storage capacitor 108 in the memory cell 106 in the period T5 is held.

A period T7 is a non-selection period. In the period T7, the potential PRE is in at high level. The bit line BL and the bit line BLB are precharged in the period T7 as in the period T1.

As described with reference to the above circuit configuration and its operation, when the bit line 105 is divided into two, each of the two lines has half the length of the one bit line 105; accordingly, the capacitance value Cb of the parasitic capacitance becomes half. When a voltage change ΔVb is fixed, cutting the capacitance value Cb of the parasitic capacitance in half leads to a reduction to half the capacitance value Cs of the storage capacitor 108 in the memory cell 106.

As described above, according to this embodiment, an increase in area of the storage capacitor 108 is controlled, so that a memory device having a memory region with a small area can be obtained.

The parasitic capacitance of the bit line can be reduced; therefore, a memory device can have a lower incidence of errors.

<Example of Cross-Sectional Structure of Memory Device>

Figure 12:
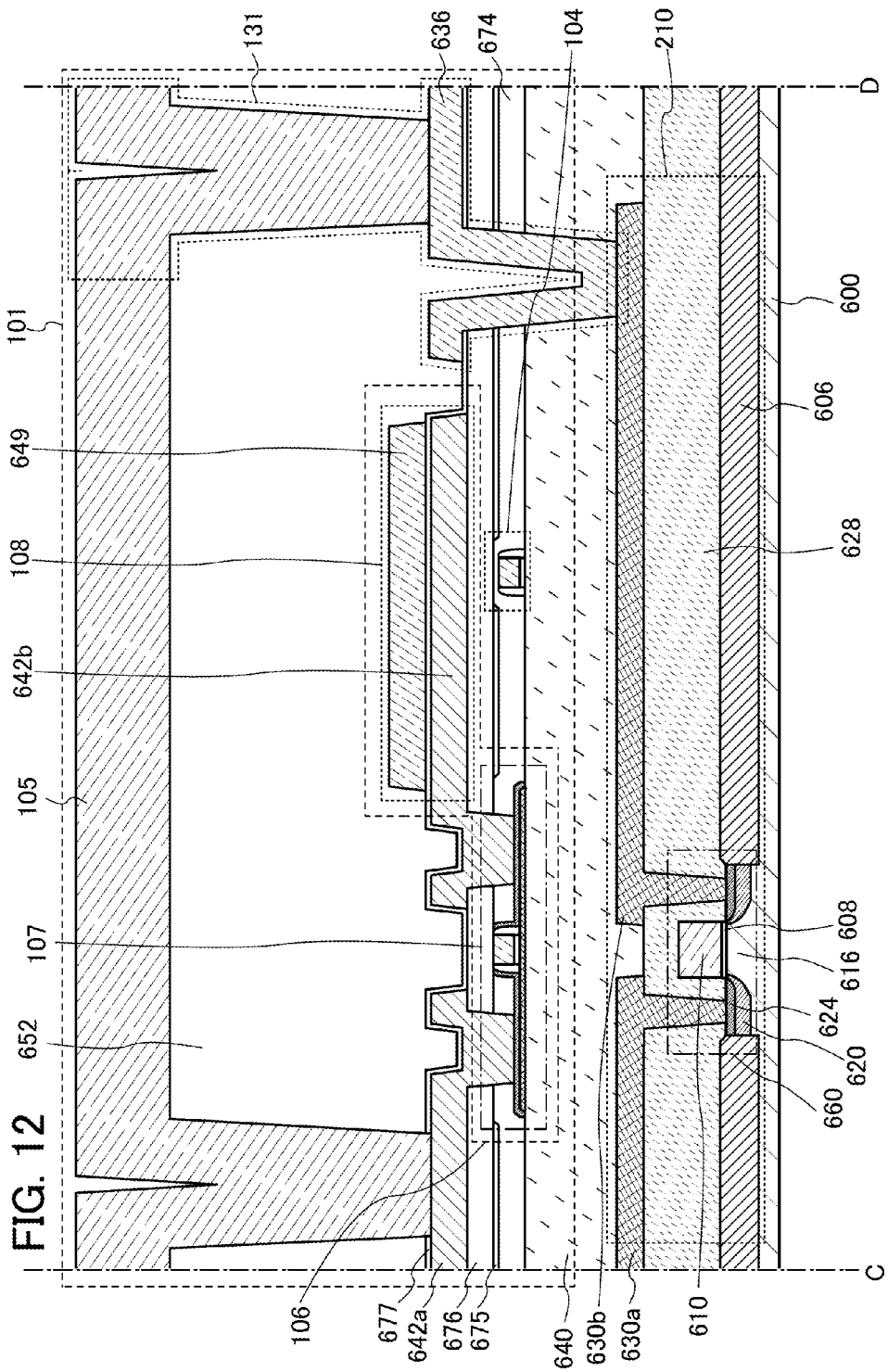
FIG. 12 is a cross-sectional view of a memory device.
Figure 13:
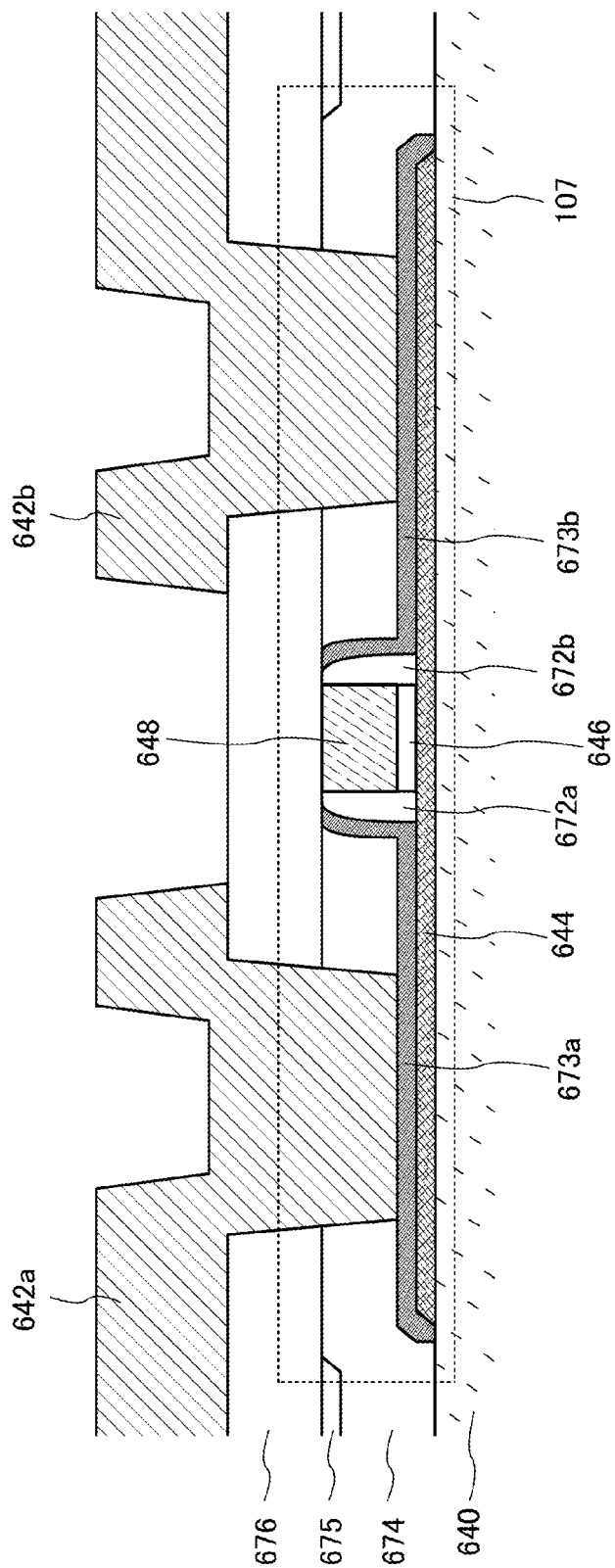
FIG. 13 is a cross-sectional view of an oxide semiconductor transistor.
Figure 20:
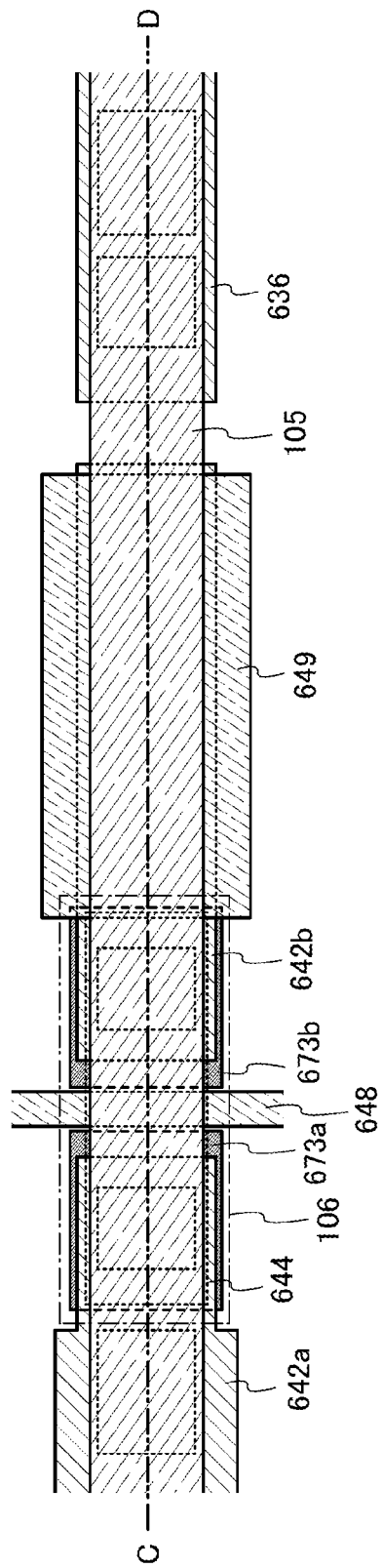
FIG. 20 is a top view of a memory device.

FIG. 20 is a top view illustrating an example of the structure of the memory device of this embodiment. FIG. 12 is a cross-sectional view taken along two-dot chain line C-D in FIG. 20. The memory device illustrated in FIG. 20 and FIG. 12 includes the memory cell array 101 provided with the plurality of memory cells 106 in an upper portion and a driver circuit 210 in a lower portion. The memory cell array 101 in the upper portion includes the oxide semiconductor transistor 107 including an oxide semiconductor film 644, and the driver circuit 210 in the lower portion includes a transistor 660 including a semiconductor such as single crystal silicon, polycrystalline silicon, single crystal germanium, or polycrystalline germanium. In addition, FIG. 13 is a magnified view of the oxide semiconductor transistor 107 shown in FIG. 12.

The driver circuit 210 corresponds to the first input/output circuit 111a, the first bit line driver circuit 112a, the first word line driver circuit 121a, the second input/output circuit 111b, the second bit line driver circuit 112b, and the second word line driver circuit 121b.

The transistor 660 can be either an n-channel transistor or a p-channel transistor. Here, the case where the transistor 660 and the oxide semiconductor transistor 107 are n-channel transistors is described below, for example.

The transistor 660 includes a channel formation region 616 provided over a substrate 600 including a semiconductor such as silicon or germanium, impurity regions 620 provided with the channel formation region 616 laid therebetween, an intermetallic compound region 624 in contact with the impurity region 620, a gate insulating film 608 provided over the channel formation region 616, the gate electrode 610 provided over the gate insulating film 608, and an electrode 630a and an electrode 630b that are source and drain electrodes electrically connected to the intermetallic compound region 624. In addition, an insulating film 628 is provided to cover the transistor 660. The electrode 630a and the electrode 630b, which are source and drain electrodes, are electrically connected to the intermetallic compound region 624 through openings penetrating the insulating film 628. In addition, an electrode 636 is formed over an insulating film 640, an insulating film 674, an insulating film 675, an insulating film 676, and an insulating film 677, which are later described. The electrode 636 is formed over the insulating film 640, the insulating film 674, the insulating film 675, the insulating film 676, and the insulating film 677, and is electrically connected to the electrode 630$b$ through an opening penetrating the insulating film 640, the insulating film 674, the insulating film 675, the insulating film 676, and the insulating film 677.

Over the substrate 600, an element isolation insulating layer 606 is provided so as to surround the transistor 660. For high integration, it is preferable that the transistor 660 do not include a sidewall insulating film as illustrated in FIG. 12. On the other hand, when the importance is put on the characteristics of the transistor 660, a sidewall insulating film may be provided on a side surface of the gate electrode 610 and the impurity regions 620 may include an impurity region having a different impurity concentration provided in a region overlapping with the sidewall insulating film.

The insulating film 640 is provided so as to surround the transistor 660. The insulating film 640 can be formed by a plasma CVD method, a sputtering method, or the like, using silicon oxide, silicon oxynitride, aluminum oxide, aluminum oxynitride, hafnium oxide, gallium oxide, or a mixed material of any of these materials.

The oxide semiconductor transistor 107 includes, over the insulating film 640, the oxide semiconductor film 644; a gate insulating film 646; and a gate electrode 648 that is provided over the gate insulating film 646 so as to overlap with the oxide semiconductor film 644. The oxide semiconductor transistor 107 includes a sidewall 672$a$ and a sidewall 672$b$ that are in contact with side surfaces of the gate insulating film 646 and the gate electrode 648. An electrode 673$a$ and an electrode 673$b$ that function as a source electrode and a drain electrode are provided to cover the sidewall 672$a$, the sidewall 672$b$, and a region of the oxide semiconductor film 644 over which the gate insulating film 646, the sidewall 672$a$, and the sidewall 672$b$ are not formed. Note that the electrode 673$a$ and the electrode 673$b$ are isolated from the gate electrode 648 by the sidewall 672$a$ and the sidewall 672$b$, respectively.

The insulating film 674 is provided over the electrode 673$a$ and the electrode 673$b$. The insulating film 675 is provided over part of the insulating film 674. The insulating film 676 is provided to cover the insulating film 674 and the insulating film 675. An electrode 642$a$ and an electrode 642$b$ that are electrically connected to the electrode 673$a$ and the electrode 673$b$, respectively, through openings penetrating the insulating film 674 and the insulating film 676 are provided.

The insulating film 677 is provided so as to cover the electrode 642$a$, the electrode 642$b$, and the insulating film 676. An electrode 649 is provided over part of the electrode 642$b$, which is electrically connected to the electrode 673$b$ functioning as one of a source electrode and a drain electrode, and over part of the insulating film 677. The electrode 649 and the part of the electrode 642$b$ function as terminals of the storage capacitor 108. The part of the insulating film 677 functions as a dielectric of the storage capacitor 108.

As described above, the electrode 636 is provided over the insulating film 640, the insulating film 674, the insulating film 675, the insulating film 676, and the insulating film 677. The electrode 636 is electrically connected to the electrode 630$b$ through the opening penetrating the insulating film 640, the insulating film 674, the insulating film 675, the insulating film 676, and the insulating film 677.

An interlayer insulating film 652 is provided so as to cover the insulating film 677, the electrode 649, and the electrode 636. The bit line 105 is provided over the interlayer insulating film 652 so as to be electrically connected to the electrode 642$a$ through an opening penetrating the interlayer insulating film 652 and the insulating film 677.

Another opening penetrating the interlayer insulating film 652 is provided to reach the electrode 636, and the bit line 105 and the electrode 636 are electrically connected to each other through the opening. As described above, the electrode 636 is connected to the electrode 630$b$. Therefore, the electrode 636 and a portion in which the bit line 105 is connected to the electrode 636 can be regarded as the connection wiring 131.

An oxide semiconductor used for the oxide semiconductor film 644 preferably contains at least indium (In) or zinc (Zn), more preferably both of In and Zn are contained. In the case of using such an oxide semiconductor, as a stabilizer for reducing oxygen vacancies of the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lantern (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn—O-based oxide" means an oxide containing In, Ga, and Zn as its main components and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0 is satisfied, and nm is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is a natural number) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3

(=⅓:⅙:½), or In:Sn:Zn=2:1:5 (=¼:⅛:⅝), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, in the case of an In—Sn—Zn oxide, high mobility can be obtained relatively easily. However, the mobility of an In—Ga—Zn-based oxide can also be increased by reducing the defect density in a bulk.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. For example, r may be 0.05. The same applies to other oxides.

The oxide semiconductor film 644 can be in a single crystal state, a polycrystalline (also referred to as polycrystal) state, an amorphous state, or the like.

The oxide semiconductor film 644 is preferably a c-axis aligned crystalline oxide semiconductor (CAAC-OS) film.

Here, a c-axis aligned crystal (CAAC) refers to a mixed phase structure of a crystal region and an amorphous region, in which a c-axis is aligned in a direction perpendicular to a surface where the oxide semiconductor film is formed or a surface of the oxide semiconductor film, triangular or hexagonal atomic arrangement is formed when seen from the direction perpendicular to the a-b plane, and metal atoms are arranged in a layered manner or metal atoms and oxygen atoms are arranged in a layered manner when seen from the direction perpendicular to the c-axis. Note that in this mixed phase structure, the directions of an a-axis and a b-axis of one CAAC may be different from those of another CAAC.

The CAAC-OS film is not completely single crystal nor completely amorphous. The CAAC-OS film is an oxide semiconductor film with a crystal-amorphous mixed phase structure. The size of a crystal is estimated to be approximately several nanometers to several tens of nanometers. In observation with a transmission electron microscope (TEM), a boundary between the amorphous part and the CAAC in the CAAC-OS film is not always clear. Further, a crystal boundary (also called "grain boundary") in the CAAC-OS film is not found. Since the CAAC-OS film does not include a crystal boundary, a reduction in electron mobility due to the crystal boundary is unlikely to occur.

In the CAAC-OS film, distribution of crystal regions in the film is not necessarily uniform. For example, in the case where crystal growth occurs from a surface side of the CAAC-OS film, in some cases, the proportion of the crystal portions in the vicinity of the surface of the CAAC-OS is high and the proportion of the amorphous portions in the vicinity of the surface where the CAAC-OS film is formed is high.

Since the c-axes of the crystal parts included in the CAAC are aligned in the direction perpendicular to the surface where the CAAC-OS film is formed or the surface of the CAAC-OS film, the directions of the c-axes of the crystal parts may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part in the CAAC is substantially perpendicular to the surface where the CAAC-OS film is formed or the surface of the CAAC-OS film. The CAAC is formed by performing treatment for crystallization such as heat treatment at the same time as or after film formation.

With use of the CAAC-OS film, change in electric characteristics of the transistor due to irradiation with visible light or ultraviolet light can be reduced, so that the highly reliable transistor can be obtained.

Note that part of oxygen included in the oxide semiconductor film may be substituted with nitrogen.

The oxide semiconductor film 644 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulsed laser deposition method, an atomic layer deposition (ALD) method, or the like as appropriate. The oxide semiconductor film 644 may be formed using a sputtering apparatus which performs film formation with surfaces of a plurality of substrates that are set substantially perpendicular to a surface of a sputtering target.

Note that although the oxide semiconductor transistor 107 includes the oxide semiconductor film 644 which is processed into an island shape in order to suppress leakage current between elements due to miniaturization, the oxide semiconductor film which is not processed into an island shape may be employed. In the case where the oxide semiconductor film is not processed into an island shape, the number of masks can be reduced.

It is preferable that the oxide semiconductor film be highly purified to contain few impurities such as copper, aluminum, and chlorine. It is preferable that steps through which these impurities do not enter the oxide semiconductor film or are not attached to the surface of the oxide semiconductor film be selected as appropriate as the manufacturing process of the transistor. When the impurities are attached to the surface of the oxide semiconductor film, it is preferable to remove impurities on the surface of the oxide semiconductor film by exposure to oxalic acid, diluted hydrofluoric acid, or the like or performance of plasma treatment (e.g., $N_2O$ plasma treatment). Specifically, the concentration of copper in the oxide semiconductor film is preferably smaller than or equal to $1 \times 10^{18}$ atoms/cm$^3$, further preferably smaller than or equal to $1 \times 10^{17}$ atoms/cm$^3$: the concentration of aluminum in the oxide semiconductor film is smaller than or equal to $1 \times 10^{18}$ atoms/cm$^3$; and the concentration of chlorine in the oxide semiconductor film is smaller than or equal to $2 \times 10^{18}$ atoms/cm$^3$.

The oxide semiconductor film is preferably in a supersaturated state in which oxygen which exceeds the stoichiometric composition is contained just after its formation. For example, when an oxide semiconductor film is formed by a sputtering method, it is preferable that the film be formed in a film formation gas containing a high percentage of oxygen, and it is especially preferable that the film be formed under an oxygen atmosphere (oxygen gas 100%). When the film is formed in a film formation gas containing a high percentage of oxygen, particularly under an oxygen atmosphere (oxygen gas 100%), even when the film formation temperature is higher than or equal to 300° C. for example, the release of Zn from the film can be suppressed.

The oxide semiconductor film is preferably highly purified by sufficient removal of impurities such as hydrogen or sufficient supply of oxygen to be in a supersaturated state. Specifically, the concentration of hydrogen in the oxide semiconductor film is smaller than or equal to $5 \times 10^{19}$ atoms/cm$^3$, preferably smaller than or equal to $5 \times 10^{18}$ atoms/cm$^3$, further preferably smaller than or equal to $5 \times 10^{17}$ atoms/cm$^3$. Note that the concentration of hydrogen in the oxide semiconductor film is measured by secondary ion mass spectrometry (SIMS). Further, for sufficient supply of oxygen to make the film in a supersaturated state, an insulating layer (e.g., SiO$_x$) containing excess oxygen is provided to be in contact with and covers the oxide semiconductor film.

To adjust the concentration of hydrogen in the insulating layer containing excess oxygen is also important because it might affect the characteristics of the transistor.

Influence of hydrogen concentration of the insulating film containing excess oxygen on the characteristics of the transistor is described.

First, hydrogen was intentionally added to the insulating layer containing excess oxygen, and the concentration of hydrogen was measured by SIMS.

A method for forming samples used for SIMS analysis is shown below.

A glass substrate was prepared, and a 300-nm-thick silicon oxide film was formed over the glass substrate by a sputtering method.

The silicon oxide film was formed using a quartz target, at a pressure of 0.4 Pa, at a power of 1.5 kW (13.56 MHz), and at a substrate temperature in film formation of 100° C.

Four samples were prepared. Note that four samples were the same as each other, except for the flow rate of an oxygen (O$_2$) gas, a deuterium (D$_2$) gas, and an argon (Ar) gas which are the gases used for formation of the silicon oxide film.

In Table 1, the following are shown: sample names, flow rate of each film formation gas used for forming the silicon oxide film, the concentrations of D (deuterium) and H (hydrogen) in the silicon oxide film at a depth of 30 nm. Note that the proportion of D$_2$ in the film formation gas (D$_2$/(O$_2$+Ar+D$_2$)) of each of the samples (Sample 1, Sample 2, Sample 3, and Sample 4) was as follows: 0 vol % (Sample 1), 0.005 vol % (Sample 2), 0.50 vol % (Sample 3), and 2.50 vol % (Sample 4).

TABLE 1

| Sample Name | O$_2$ [sccm] | Ar [sccm] | D$_2$ [sccm] | Proportion of D$_2$ | Concentration of D [atoms/cm$^3$] | Concentration of H [atoms/cm$^3$] |
|---|---|---|---|---|---|---|
| Sample 1 | 25 | 25 | 0 | 0% | 5.1E+15 | 6.4E+19 |
| Sample 2 | 25 | 24.9975 | 0.0025 | 0.005% | 1.6E+19 | 1.4E+20 |
| Sample 3 | 25 | 24.75 | 0.25 | 0.5% | 5.6E+20 | 7.2E+19 |
| Sample 4 | 25 | 23.75 | 1.25 | 2.5% | 7.2E+20 | 1.9E+19 |

Table 1 shows that as the proportion of D$_2$ in the film formation gas becomes higher, the concentration of D contained in the silicon oxide film becomes higher.

Next, transistors including Samples 1 to 4 shown in Table 1 were formed.

Figure 19A:
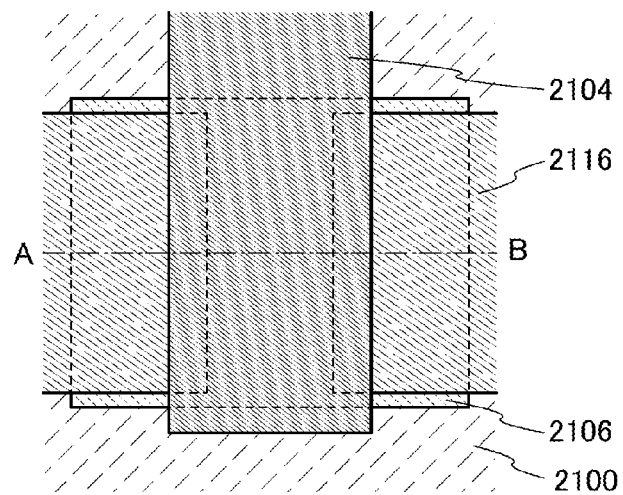
FIG. 19A is a top view of an oxide semiconductor transistor and FIG. 19B is a cross-sectional view thereof.
Figure 19B:
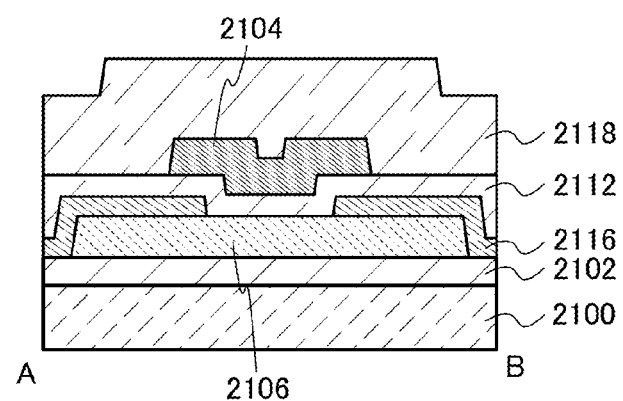

FIG. 19A is the top view of the transistor used for the measurement. FIG. 19B is a cross-sectional view along dashed-dotted line A-B in FIG. 19A. Note that for simplicity, a protective insulating film 2118, a gate insulating film 2112, an insulating layer 2102, and the like are omitted in FIG. 19A.

The transistor illustrated in FIG. 19B includes a substrate 2100, the insulating layer 2102 that includes excess oxygen and is over the substrate 2100, an oxide semiconductor film 2106 over the insulating layer 2102, a pair of electrodes 2116 over the oxide semiconductor film 2106, the gate insulating film 2112 covering the oxide semiconductor film 2106 and the pair of electrodes 2116, a gate electrode layer 2104 overlapping with the oxide semiconductor film 2106 with the gate insulating film 2112 laid therebetween, and the protective insulating film 2118 over the gate electrode layer 2104 and the gate insulating film 2112.

The insulating layer 2102 was one of Samples 1 to 4 shown in Table 1. The thickness of the insulating layer 2102 was 300 nm.

The substrate 2100 was formed of glass. The oxide semiconductor film 2106 was a 20-nm-thick IGZO film (which is formed using a target containing In:Ga:Zn in an atomic ration of 1:1:1). The pair of electrodes 2116 were each a 100-nm-thick tungsten layer. The gate insulating film 2112 was a 30-nm-thick silicon oxynitride film. The gate electrode layer 2104 was a 15-nm-thick tantalum nitride film and a 135-nm-thick tungsten film, which were stacked from the gate insulating film 2112 side. The protective insulating film 2118 was a 300-nm-thick silicon oxynitride film.

A BT stress test was conducted on the transistor having the above structures. Note that in the measurement, a transistor having a channel length L of 10 μm, a channel width W of 10 μm, and each $L_{ov}$ of 1 μm. Note that $L_{ov}$ is the length of the portion in which the gate electrode layer 2104 overlaps with each of the pair of electrodes 2116 in a channel length direction; that is, the total $L_{ov}$ of the transistor is 2 μm. The method of the conducted BT stress test is described below.

First, the drain current Id was measured in the following conditions: the substrate temperature was 25° C., the drain voltage Vd was 3 V, and the gate voltage Vg was swept from −6 V to 6 V. The characteristics of the transistor on such conditions are referred to as the characteristics of the transistor before the BT stress test.

Next, the conditions that Vd and Vg were kept to 0.1 V and −6 V respectively, for one hour at a substrate temperature of 150° C.

Next, increases in the Vd, the Vg, and the temperature were stopped, and the Id was measured in the following conditions: the substrate temperature was 25° C., the drain voltage Vd was 3 V and the gate voltage Vg was swept from −6 V to 6 V. The characteristics of the transistor on such conditions are referred to as the characteristics of the transistor after the BT stress test.

Table 2 shows a threshold voltage Vth and a field effect mobility $\mu_{FE}$ before and after the BT stress test. Sample names in Table 2 correspond to those in Table 1.

TABLE 2

| | Before BT Stress Test | | After BT Stress Test | |
|---|---|---|---|---|
| Sample Names | Vth [V] | $\mu_{FE}$ [cm$^2$/Vs] | Vth [V] | $\mu_{FE}$ [cm$^2$/Vs] |
| Sample 1 | 0.94 | 8.6 | 1.17 | 7.8 |
| Sample 2 | 0.82 | 8.6 | 1.03 | 8.2 |
| Sample 3 | 0.89 | 8.8 | 1.05 | 7.8 |
| Sample 4 | 0.71 | 8.7 | 0.43 | 2.5 |

Table 2 shows that $\mu_{FE}$ in Sample 4 is markedly reduced after the BT stress test.

Further, it is found that the variation of Vth in the negative direction becomes greater in Sample 4 as compared to the other samples.

As described above, a transistor in which a silicon oxide film is in contact with an oxide semiconductor film has abnormal characteristics when the concentration of D in the silicon oxide film is $7.2 \times 10^{20}$ atoms/cm$^3$.

In the case where the concentration of deuterium in an insulating layer containing excess oxygen is greater than or equal to $7.2 \times 10^{20}$ atoms/cm$^3$, variation in initial characteristics of the transistor is increased, a channel length dependence of electric characteristics of the transistor is increased, and the transistor significantly deteriorates in the BT stress test; therefore, the concentration of hydrogen in the insulating layer containing excess oxygen is preferably smaller than $7.2 \times 10^{20}$ atoms/cm$^3$. In other words, the concentration of hydrogen in the oxide semiconductor film is preferably smaller than or equal to $5 \times 10^{19}$ atoms/cm$^3$, and the concentration of hydrogen in the insulating layer containing excess oxygen is preferably smaller than $7.2 \times 10^{20}$ atoms/cm$^3$.

A blocking layer (e.g., AlO$_x$) that prevents oxygen from diffusing into the oxide semiconductor film is preferably formed outside the insulating layer containing excess oxygen to cover the oxide semiconductor film.

The oxide semiconductor film is covered with the insulating layer containing excess oxygen or a blocking layer, so that the oxide semiconductor film can be in a state in which oxygen the amount of which is approximately the same as the stoichiometric composition is contained or in a supersaturated state in which oxygen which exceeds the stoichiometric composition is contained. For example, when the oxide semiconductor film is an IGZO film, and the stoichiometric composition of the oxide semiconductor film is In:Ga:Zn:O=1:1:1:4 [atomic ratio], an atomic ratio of oxygen in IGZO is more than four.

Note that an end portion of the electrode 642*b* which functions as the source or drain electrode of the oxide semiconductor transistor 107 or one terminal of the storage capacitor 108 preferably has a tapered shape. The end portion of the electrode 642*b* is tapered, the coverage with the insulating film 677 can be improved and disconnection of the insulating film 677 in the above end portion can be prevented. Here, the taper angle is greater than or equal to 30° and less than or equal to 60°, for example. A taper angle is a tilt angle formed by a side surface and the bottom surface of a film having a tapered shape (e.g., the electrode 642*a*) in the case where the film is observed from the direction perpendicular to a cross section (the plane perpendicular to a surface of a substrate).

The word line 104 is electrically connected to the driver circuit 210 in the lower portion through the connection wiring 131, similarly to the bit line 105.

Note that an example in which one layer of the memory cell array 101 is stacked over the driver circuit 210 is shown in FIG. 12; however the memory device of this embodiment is not limited thereto, and two or more layers of the memory cell arrays may be stacked. In other words, the memory cell array 101 can be formed using a plurality of memory cell array layers. Note that a second memory cell array layer is provided over a first memory cell array layer. The same is applied to memory cell array layers of three or more layers. Further, a structure similar to that of the first memory cell array layer can be applied to the memory cell array layers of two or more layers. Alternatively, a structure different from that of the first memory cell array layer can also be applied to the memory cell array layers of two or more layers. With such a stacked structure, still higher integration of the memory device can be achieved.

One example of a method for manufacturing the oxide semiconductor transistor 107 is described with reference to FIGS. 14A to 14D and FIGS. 15A to 15C.

First, the oxide semiconductor film 644 is formed over the insulating film 640 that is over the driver circuit 210 (see FIG. 14A). Materials used for the insulating film 640 and the oxide semiconductor film 644 are described above.

After the formation of the insulating film 640, the insulating film 640 is cut (ground or polished). A chemical mechanical polishing (CMP) method is employed as the cutting (grinding or polishing) method.

After the insulating film 640 is cut, an oxide semiconductor film is formed. Note that in this embodiment, a target used for forming the oxide semiconductor film 644 by a sputtering method is, for example, an oxide target having a composition of In:Ga:Zn=3:1:2 [atomic ratio], so that an In—Ga—Zn-based oxide film (IGZO film) is formed.

As a sputtering gas used for forming the oxide semiconductor film, it is preferable to use a high-purity gas from which an impurity such as hydrogen, water, a hydroxyl group, or hydride is removed.

The substrate is held in a film formation chamber kept under reduced pressure. Then, moisture remaining in the deposition chamber is removed, and a sputtering gas from which hydrogen and moisture are removed is introduced, so that the oxide semiconductor film is formed using the above target, over the insulating film 640. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the case where the film formation chamber is evacuated with the cryopump, a hydrogen atom, a compound containing a hydrogen atom such as water (H$_2$O), a compound containing a carbon atom, and the like, for example, are removed from the chamber, whereby the concentration of an impurity contained in the oxide semiconductor film 644 formed in the film formation chamber can be reduced.

The oxide semiconductor film 644 can be formed by processing an oxide semiconductor film into an island shape by a photolithography process.

A resist mask which is used in the formation of the island-shaped oxide semiconductor film 644 may be formed by an ink-jet method. Formation of the resist mask by an inkjet method needs no photomask; thus, manufacturing cost can be reduced.

Note that the etching of the oxide semiconductor film may be dry etching, wet etching, or both dry etching and wet etching. An etchant used for wet etching of the oxide semiconductor film can be, for example, a mixed solution of phosphoric acid, acetic acid, and nitric acid, or the like. ITO-07N (produced by KANTO CHEMICAL CO., INC.) may also be used. Alternatively, the oxide semiconductor film may be etched by a dry etching method using an inductively coupled plasma (ICP) etching method. For example, an IGZO film is etched by the ICP etching method (the etching conditions: an etching gas of BCl$_3$ and Cl$_2$ (BCl$_3$:Cl$_2$=60 sccm:20 sccm), a power of 450 W, a bias power of 100 W, and a pressure of 1.9 Pa), so that the IGZO film is processed into an island shape.

Further, heat treatment may be performed on the oxide semiconductor film 644 in order to remove excess hydrogen (including water and a hydroxyl group), that is, to perform dehydration or dehydrogenation. The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is introduced into an electric furnace which is one of heat treatment apparatuses, and the heat treatment is performed on the oxide semiconductor film 644 at 450° C. in a nitrogen atmosphere for 1 hour.

Further, a heat treatment apparatus used is not limited to an electric furnace, and a device for heating a process object by heat conduction or heat radiation from a heating element such as a resistance heating element may be alternatively used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas that does not react with an object to be processed by heat treatment, for example, nitrogen or a rare gas such as argon, is used.

For example, as the heat treatment, GRTA may be performed as follows: the substrate is put in an inert gas heated at high temperature of 650° C. to 700° C., is heated for several minutes, and is taken out of the inert gas.

Note that in heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher; that is, the impurity concentration is preferably 1 ppm or lower, further preferably 0.11 ppm or lower.

The timing of the heat treatment for dehydration or dehydrogenation may be either after the formation of the oxide semiconductor film or after the formation of the island-shaped oxide semiconductor film 644.

The heat treatment for dehydration or dehydrogenation may be performed plural times, and may also serve as heat treatment for another purpose.

Further or alternatively, oxygen (which includes at least one of an oxygen radical, an oxygen atom, and an oxygen ion) may be added to the oxide semiconductor film 644 after being subjected to the dehydration or dehydrogenation treatment to supply oxygen to the oxide semiconductor film 644.

The dehydration or dehydrogenation treatment may be accompanied by elimination of and a reduction in oxygen which is a main constituent material of an oxide semiconductor. In an oxide semiconductor film, an oxygen vacancy is created by elimination of oxygen and forms a donor level which leads to a change in the electric characteristics of a transistor.

Addition and supply of oxygen to the dehydrated or dehydrogenated oxide semiconductor film 644 achieves a highly purified and electrically i-type (intrinsic) oxide semiconductor film 644. The oxide semiconductor transistor including an electrically i-type (intrinsic) oxide semiconductor film 644, which is obtained by high purification, has smaller variation in the electric characteristics and is electrically stable.

Oxygen can be added by an ion implantation method, an ion doping method, a plasma immersion ion implantation method, plasma treatment, or the like.

In the step of introducing oxygen, oxygen may be directly added to the oxide semiconductor film 644 or added to the oxide semiconductor film 644 through another film such as the gate insulating film 646. An ion implantation method, an ion doping method, a plasma immersion ion implantation method, or the like may be employed for the addition of oxygen through another film, whereas plasma treatment or the like can also be employed for the addition of oxygen directly into the exposed oxide semiconductor film 644.

The addition of oxygen to the oxide semiconductor film 644 is preferably performed after dehydration or dehydrogenation treatment is performed thereon, but the timing is not limited thereto. Further, the number of times of the addition of oxygen into the dehydrated or dehydrogenated oxide semiconductor film 644 is not limited.

Next, an insulating film 645 is formed to cover the oxide semiconductor film 644 (see FIG. 14A).

The insulating film 645 has a thickness of larger than or equal to 1 nm and smaller than or equal to 20 nm and can be formed by a sputtering method, a MBE method, a CVD method, a pulse laser deposition method, an ALD method, or the like as appropriate. The insulating film 645 may be formed using a sputtering apparatus which forms a film with surfaces of a plurality of substrates set substantially perpendicular to a surface of a sputtering target.

The insulating film 645 can be formed using a silicon oxide film, a gallium oxide film, an aluminum oxide film, a silicon nitride film, a silicon oxynitride film, an aluminum oxynitride film, or a silicon nitride oxide film. Note that the insulating film 645 preferably contains oxygen in a portion in contact with the oxide semiconductor film 644. In particular, the insulating film 645 preferably contains a large amount of oxygen which exceeds at least the stoichiometry in (a bulk of) the film. For example, in the case where a silicon oxide film is used as the insulating film 645, the composition formula is $SiO_{2+\alpha}$ ($\alpha>0$). In this embodiment, a silicon oxide film of $SiO_{2+\alpha}$ ($\alpha>0$) is used as the insulating film 645. By using the silicon oxide film as the insulating film 645, oxygen can be supplied to the oxide semiconductor film 644, so that favorable characteristics can be obtained. Further, the insulating film 645 is preferably formed in consideration of the size of a transistor to be formed and the step coverage with the insulating film 645.

When the insulating film 645 is formed using a high-k material such as hafnium oxide, yttrium oxide, hafnium silicate ($HfSi_xO_y$ ($x>0$, $y>0$)), hafnium silicate containing nitrogen ($HfSiO_xN_y$ ($x>0$, $y>0$)), hafnium aluminate ($HfAl_xO_y$ ($x>0$, $y>0$)), or lanthanum oxide, gate leakage current can be reduced. The insulating film 645 may have either a single-layer structure or a stacked-layer structure.

Next, a conductive film is formed over the insulating film 645 and is etched into the gate electrode 648 (see FIG. 14B).

The gate electrode 648 can be formed using a metal material such as molybdenum, titanium, tantalum, tungsten, aluminum, copper, chromium, neodymium, or scandium, or an alloy material containing any of these materials as a main component. Alternatively, a semiconductor film typified by a polycrystalline silicon film doped with an impurity element such as phosphorus, or a silicide film such as a nickel silicide film may be used as the gate electrode 648. The gate electrode 648 may have either a single-layer structure or a stacked-layer structure.

Next, a dopant is added to the oxide semiconductor film 644 using as a mask, whereby the low-resistance regions are formed in part of the oxide semiconductor film 644 which does not overlap with the gate electrode 648.

The dopant is an impurity by which the conductivity of the oxide semiconductor film 644 is changed. As the dopant, one or more of a Group 15 element (typically nitrogen (N), phosphorus (P), arsenic (As), and antimony (Sb)), boron (B), aluminum (Al), argon (Ar), neon (Ne), indium (In), titanium (Ti), and zinc (Zn) can be used.

The dopant can be added to the oxide semiconductor film 644 through other films (e.g., the insulating film 645) by an implantation method. As the method for adding the dopant, an ion implantation method, an ion doping method, a plasma immersion ion implantation method, or the like can be used.

The addition of the dopant may be controlled by setting the addition conditions such as the acceleration voltage and the dosage, or the thickness of the films through which the dopant passes as appropriate. In this embodiment, phosphorus is used as the dopant, whose ion is added by an ion implantation method. The dosage of the dopant is preferably set to be greater than or equal to $1 \times 10^{13}$ ions/cm$^2$ and less than or equal to $5 \times 10^{16}$ ions/cm$^2$.

The concentration of the dopant in the low-resistance regions is preferably higher than or equal to $5 \times 10^{18}$ atoms/cm$^3$ and lower than or equal to $1 \times 10^{22}$ atoms/cm$^3$.

The dopant may be added while the transistor 660, the electrode 630a, the electrode 630b, the oxide semiconductor film 644, the gate electrode 648, and the insulating film 645 are heated.

The addition of dopant to the oxide semiconductor film 644 may be performed plural times, and plural kinds of dopant may be used.

Heat treatment may be performed thereon after the dopant addition. The heat treatment is preferably performed at a temperature(s) higher than or equal to 300° C. and lower than or equal to 700° C. (further preferably higher than or equal to 300° C. and lower than or equal to 450° C.) for one hour under an oxygen atmosphere. The heat treatment may be performed under a nitrogen atmosphere, reduced pressure, or the air (ultra-dry air).

In this embodiment, phosphorus (P) ions are implanted to the oxide semiconductor film 644 by an ion implantation method. Note that the conditions of the phosphorus (P) ion implantation are as follows: the acceleration voltage is 30 kV and the dosage is $1.0 \times 10^{15}$ ions/cm$^2$.

When the oxide semiconductor film 644 is a CAAC-OS film, addition of the dopant sometimes makes the oxide semiconductor layer partly amorphous. In that case, the crystallinity of the oxide semiconductor layer 644 can be recovered by performing heat treatment thereon after the addition of the dopant.

Through the above steps, low-resistance regions are formed in part of the oxide semiconductor film 644 which does not overlap with the gate electrode 648, and a channel formation region is formed in part of the oxide semiconductor film 644 which overlaps with the gate electrode 648. The channel formation region is sandwiched between a pair of low-resistance regions.

Next, an insulating film is formed over the gate electrode 648 and etched so that the sidewall 672a and the sidewall 672b are formed. Part of the insulating film 645 which does not overlap with the gate electrode 648, the sidewall 672a, and the sidewall 672b is etched using the gate electrode 648, the sidewall 672a, and the sidewall 672b as a mask so as to form the gate insulating film 646 (see FIG. 14C).

As the sidewall 672a and the sidewall 672b, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be typically used. The sidewall 672a and the sidewall 672b can be formed by a plasma CVD method, a sputtering method, or the like. In this embodiment, a silicon oxynitride film formed by a CVD method is used.

Then, a conductive film that is to be a source electrode and a drain electrode (including a wiring formed in the same layer as the source electrode and the drain electrode) is formed over the oxide semiconductor film 644, the gate insulating film 646, the gate electrode 648, the sidewall 672a, and the sidewall 672b.

The conductive film is formed using a material that can withstand heat treatment in a later step. As the conductive film used for the source electrode and the drain electrode, for example, a metal film containing an element selected from Al, Cr, Cu, Ta, Ti, Mo, and W, a metal nitride film containing any of the above elements as its component (e.g., a titanium nitride film, a molybdenum nitride film, or a tungsten nitride film), or the like can be used. A film of a metal having a high melting point such as Ti, Mo, or W, or a metal nitride film of any of these elements (a titanium nitride film, a molybdenum nitride film, and a tungsten nitride film) may be stacked on one of or both of a lower side or an upper side of a metal film of Al, Cu, or the like.

A resist mask is formed over the conductive film by a photolithography process and the conductive film is selectively etched, whereby an island-shaped conductive film 678 is formed (see FIG. 14D). After that, the resist mask is removed. Note that the conductive film 678 over the gate electrode 648 is not removed in this etching step.

The selective etching removes the conductive film formed over the word line 104 of the adjacent memory cell illustrated in FIG. 12.

In the case where a 20-nm-thick tungsten film is used as the conductive film, the tungsten film may be etched by, for example, a dry etching method (etching conditions: an etching gas of CF$_4$, Cl$_2$, and O$_2$ (CF$_4$:Cl$_2$:O$_2$=55 sccm:45 sccm:55 sccm), a power of 3000 W, a bias power of 140 W, and a pressure of 0.67 Pa) to have an island shape.

The insulating film 674 and the insulating film 675 are stacked over the island-shaped conductive film 678 (see FIG. 15A).

The insulating film 674 may be an inorganic insulating film with high density (typically, an aluminum oxide film) and preferably includes at least an aluminum oxide film. The insulating film 674 may be either a single-layer film or a stacked-layer film.

As the insulating film 675, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be typically used. The insulating film 675 can be formed by a plasma CVD method, a sputtering method, or the like.

Next, the insulating film 674 and the insulating film 675 are cut (ground or polished) by a chemical mechanical polishing (CMP) method. By the cutting (grinding or polishing) process, part of the insulating film 674, part of the insulating film 675, and part of the conductive film 678 are removed to expose the gate electrode 648. Through the cutting (grinding or polishing) process, the conductive film 678 is formed into the electrode 673a and the electrode 673b that are the source electrode and the drain electrode. The electrode 673a and the electrode 673b are isolated by the sidewall 672a and the sidewall 672b.

A chemical mechanical polishing method is used for removing part of the insulating film 674, part of the insulating film 675, part of the conductive film 678 in this embodiment; however, another cutting (grinding or polishing) method may be used. Further, in the step of removing the conductive film 678 over the gate electrode 648, an etching (dry etching or wet etching) method, plasma treatment, or the like may be used in combination with the cutting (grinding or polishing) method such as a chemical mechanical polishing method. For example, after the removing step by a chemical mechanical polishing method, dry etching or plasma treatment (e.g., reverse sputtering) may be performed in order to improve the flatness of the processed surface. In the case where a cutting (grinding or polishing) method is used in combination with etching, plasma treatment, or the like, the order of the steps is not limited and may be set as appropriate in accordance with the material, thickness, and surface unevenness of the insulating film 674, the insulating film 675, and the conductive film 678.

Note that in this embodiment, the electrode 673a and the electrode 673b, which are a source electrode and a drain electrode, are provided to be in contact with side surfaces of the sidewall 672a and the sidewall 672b that are in contact with the side surfaces of the gate electrode 648, respectively.

Through the above steps, the oxide semiconductor transistor 107 of this embodiment is manufactured (see FIG. 15B).

Next, the insulating film 676 is formed to cover the oxide semiconductor transistor 107, the insulating film 674, and the insulating film 675 (see FIG. 15C).

As the insulating film 676, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be typically used. The insulating film 676 can be formed by a plasma CVD method, a sputtering method, or the like.

Part of the insulating film 676 is etched to form openings reaching the electrode 673a and the electrode 673b. After the formation of the openings, a conductive film is formed over the insulating film 676. As the conductive film, for example, a metal film containing an element selected from Al, Cr, Cu, Ta, Ti, Mo, and W, a metal nitride film containing any of the above elements as its component (e.g., a titanium nitride film, a molybdenum nitride film, or a tungsten nitride film), or the like can be used. A film of a metal having a high melting point such as Ti, Mo, or W, or a metal nitride film of any of these elements (a titanium nitride film, a molybdenum nitride film, and a tungsten nitride film) may be stacked on one of or both of a lower side or an upper side of a metal film of Al, Cu, or the like.

Then, part of the conductive film is removed by etching, whereby the electrode 642a that is electrically connected to the electrode 673a functioning as the other of the source electrode and the drain electrode and the electrode 642b that is electrically connected to the electrode 673b functioning as one of the source electrode and the drain electrode (see FIG. 13).

<Semiconductor Device>

An example of a semiconductor device having the above memory device is described below. The semiconductor device can be improved in reliability and can be smaller by using the memory device according to one embodiment of the disclosed invention. In particular, making a portable semiconductor device smaller by using the memory device according to one embodiment of the disclosed invention offers an advantage in convenience of users.

Figure 16A:
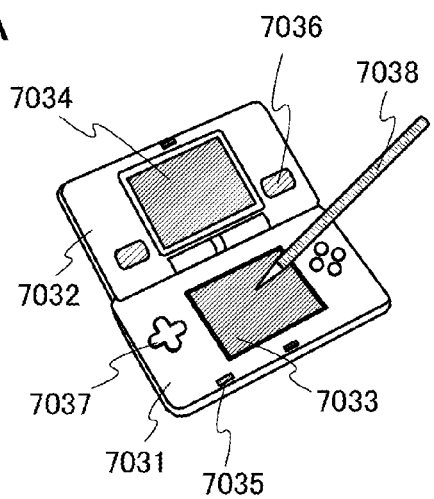
FIGS. 16A to 16C illustrate concrete examples of a semiconductor device.
Figure 16B:
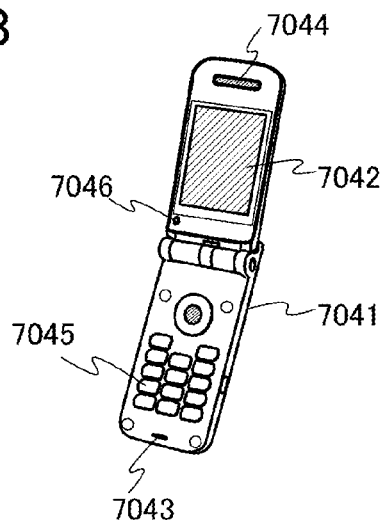
Figure 16C:
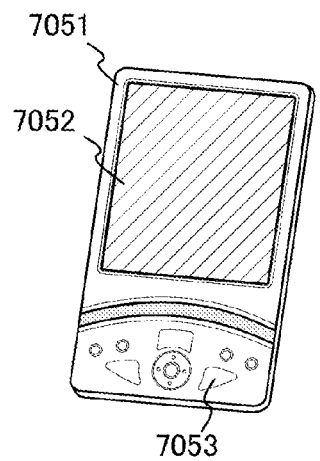

The memory device according to one embodiment of the disclosed invention can be used for display devices, laptop personal computers, or image reproducing devices provided with recording media (typically devices which reproduce the content of recording media such as digital versatile discs (DVDs) and have displays for displaying the reproduced images). Other than the above, examples of a semiconductor device which can use the memory device according to one embodiment of the disclosed invention are mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, and automated teller machines (ATM), vending machines. FIGS. 16A to 16C illustrate specific examples of these semiconductor devices.

FIG. 16A illustrates a portable game machine including a housing 7031, a housing 7032, a display portion 7033, a display portion 7034, a microphone 7035, speakers 7036, an operation key 7037, a stylus 7038, and the like. The memory device according to one embodiment of the disclosed invention can be used for an integrated circuit for controlling driving of the portable game machine, in which case, a highly reliable and/or compact portable game machine can be provided. Although the portable game machine illustrated in FIG. 16A includes two display portions, the display portion 7033 and the display portion 7034, the number of display portions included in the portable game machine is not limited to two.

FIG. 16B illustrates a mobile phone including a housing 7041, a display portion 7042, an audio input portion 7043, an audio output portion 7044, operation keys 7045, a light-receiving portion 7046, and the like. Light received in the light-receiving portion 7046 is converted into electrical signals, whereby external images can be loaded. The memory device according to one embodiment of the disclosed invention can be used for an integrated circuit for controlling driving of the mobile phone, in which case, a highly reliable and/or compact mobile phone can be provided.

FIG. 16C illustrates a portable information terminal including a housing 7051, a display portion 7052, operation keys 7053, and the like. A modem may be incorporated in the housing 7051 of the portable information terminal illustrated in FIG. 16C. The memory device according to one embodiment of the disclosed invention can be used for an integrated circuit for controlling driving of the portable information terminal, in which case, a highly reliable and/or compact information terminal can be provided.

As described above, according to this embodiment, a memory device can have a sufficient data retention period and a higher memory capacity per unit area. Alternatively, according to this embodiment, a memory device can have a lower incidence of errors and a higher memory capacity per unit area. Further alternatively, according to this embodiment, employing the memory device achieves a highly reliable semiconductor device.

Example

In this example, operation of a memory device described in the embodiment is described.

FIGS. 21A and 21B are circuit diagrams of a memory device used in this example. The memory device illustrated in FIG. 21A includes a memory cell array 401 (8 kb DOSRAM ARRAY), an input/output circuit 411, a bit line driver circuit 412 (also referred to as COLUMN DRIVER), and a word line driver circuit 421 (also referred to as ROW DRIVER).

Note that in this specification, "DOSRAM" is an abbreviation for "dynamic oxide semiconductor random access memory" and is a memory device using the oxide semiconductor transistor described in the above embodiment as a selection transistor (a transistor as a switching element) of a memory cell. Extremely low off-state current of a selection transistor of a memory cell allows DOSRAM to retain data for a long time; accordingly, a refresh cycle can be extremely long.

The memory cell array 401 includes a plurality of memory cells 406 (also referred to as CELLs), a plurality of bit lines 405 (also referred to as BLs or Column Lines), and a plurality of word lines 404 (also referred to as WLs or Row Lines). The memory cell array 401 of this example includes an 8-kb memory cell 406.

The memory cell array 401 of this example corresponds to a group of the memory cell arrays 101a to 101d of the above embodiment. The input/output circuit 411 of this example corresponds to each of the first and second input/output circuits 111a and 111b of the above embodiment. The bit line driver circuit 412 of this example corresponds to each of the first and second bit line driver circuits 112a and 112b of the above embodiment. The word line driver circuit 421 of this example corresponds to each of the first and second word line driver circuits 121a and 121b of the above embodiment.

That is, in the memory device of this example, the memory cell array 401 is stacked over the input/output circuit 411, the bit line driver circuit 412, and the word line driver circuit 421.

The memory cell array 401 is divided into a plurality of memory cell arrays. The input/output circuit 411, the bit line driver circuit 412, and the word line driver circuit 421 are each divided into two or more in accordance with the number of memory cell arrays into which the memory cell array 401 is divided. The divided memory cell arrays 401 are arranged over the corresponding divided input/output circuits 411, the corresponding divided bit line driver circuits 412, and the corresponding divided word line driver circuits 421.

The bit line driver circuit 412 includes a decoder 413 (also referred to as COLUMN DECODER and corresponding to the decoder 113) and a SENSE AMPS IO GATING 416 functioning as a selector and a reading circuit.

The input/output circuit 411 includes a DATA-IN BUFFER 481, a DATA-OUT BUFFER 482, and a CONTROLLER 483.

The SENSE AMPS IO GATING 416 includes a plurality of sense amplifiers 435 (SENSE AMP). The plurality of sense amplifiers 435 are each electrically connected to the memory cell 406 through the bit line 405 (see FIG. 21B). Note that the sense amplifier 435 corresponds to the amplifying element 135 of the above embodiment. When, as shown in FIG. 17, one of the two bit lines 405 and the other thereof are the bit line BL and the bit line BLB, respectively and the potential applied to the bit line BL and the potential applied to the bit line BLB are the potential BL and the potential BLB, respectively, the potential BL and the potential BLB are changed as shown in FIG. 18.

The DATA-IN BUFFER 481 is a buffer circuit for temporarily storing data input from the outside to the memory device. The DATA-IN BUFFER 481 is electrically connected to a terminal DIN (data input) and the SENSE AMPS IO GATING 416.

Note that a potential applied to a terminal has the same name as the terminal. For example, a potential DIN is applied to the terminal DIN electrically connected to the DATA-IN BUFFER 481; accordingly, the potential DIN is applied to the DATA-IN BUFFER 481. Note that the potential DIN is the potential of a signal input from the outside to the memory device.

The DATA-OUT BUFFER 482 is a buffer circuit for temporarily storing data input from the memory device to the outside. The DATA-OUT BUFFER 482 is electrically connected to a terminal DOUT (data output), the CONTROLLER 483, and the SENSE AMPS IO GATING 416. A potential DOUT applied to the terminal DOUT the potential of a signal output from the memory device to the outside.

The CONTROLLER 483 is a control circuit for controlling the DATA-IN BUFFER 481, the DATA-OUT BUFFER 482, the decoder 413, the SENSE AMPS IO GATING 416, and the word line driver circuit 421. The CONTROLLER 483 is electrically connected to a terminal CLE (column line enable), a terminal RWB (read-write bar), a terminal PRE (precharge), a terminal SAE (sense amp enable), a terminal WLE (word line enable), the DATA-OUT BUFFER 482, the SENSE AMPS IO GATING 416, and the decoder 413. Note that a potential PRE applied to the terminal PRE is equal to the potential PRE shown in FIG. 17. A read operation and a write operation are switched depending on the level of a potential RWB applied to the terminal RWB.

The word line driver circuit 421 is electrically connected to the terminal RA[5:0](row address[5:0]; terminals RA[0] to RA[5]), a terminal VH, a terminal VL, the CONTROLLER 483, and the memory cell array 401.

Note that a potential VH applied to the terminal VH is higher than the high power supply potential VDD and also used as a power supply potential. A potential VL applied to the terminal VL is lower than the low power supply potential VSS and also used as a power supply potential.

The decoder 413 is electrically connected to the terminal CA[6:0](column address[6:0]; terminals CA[0] to CA[6]), the CONTROLLER 483, and the SENSE AMPS IO GATING 416.

The SENSE AMPS IO GATING 416 is electrically connected to the terminal VPRE (voltage precharge), the decoder 413, the DATA-IN BUFFER 481, the DATA-OUT BUFFER 482, the CONTROLLER 483, and the memory cell array 401. Note that a potential VPRE applied to the terminal VPRE is equal to the potential VPRE shown in FIG. 17.

Figure 22A:
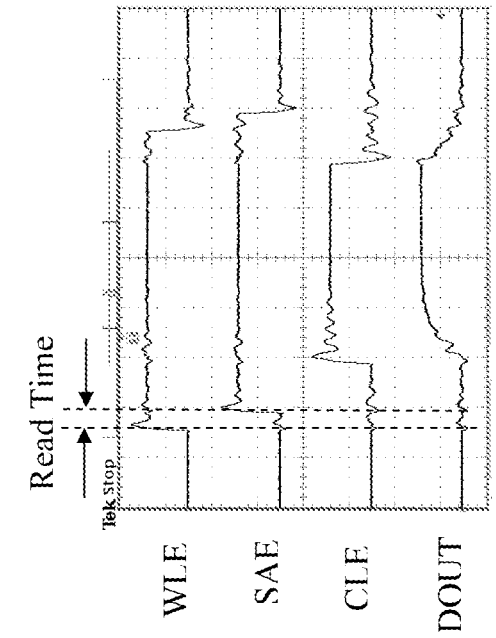
FIGS. 22A and 22B each show operation waveforms of a memory device.
Figure 22B:
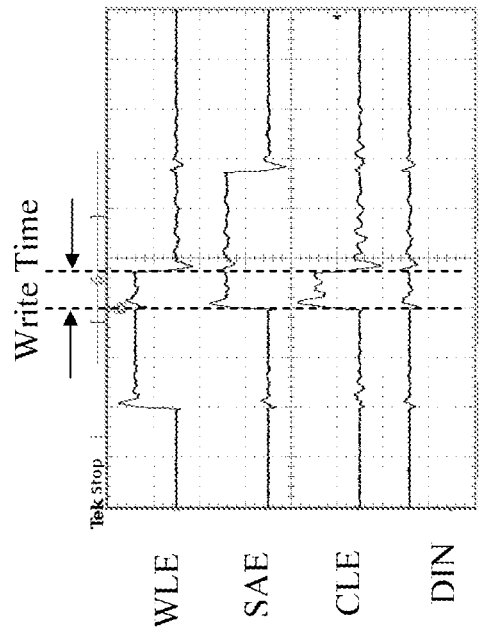

FIGS. 22A and 22B show operation waveforms of the memory device of this example. FIG. 22A shows the waveforms of a potential WLE (word line enable), a potential SAE (sense amp enable), a potential CLE (column line enable), and the potential DIN (data input), in the case where data "1" (high-level potential) is written. FIG. 22B shows the waveforms of the potential WLE, the potential SAE, the potential CLE, and the potential DOUT (data output), in the case where the data "1" (high-level potential) is read.

When the data "1" (high-level potential) is written, a signal of the data "1" (high-level potential) is supplied as the potential DIN, and the potential CLE becomes "1" (high-level potential) while the potential WLE and the potential SAE are "1" (high-level potential), whereby a bit line (column line) is selected. Thus, the data "1" (high-level potential) is written.

When the data "1" (high-level potential) is read, the potential CLE becomes data "1" (high-level potential) while the potential WLE and the potential SAE are data "1" (high-level potential); accordingly, the potential DOUT is changed to the data "1" (high-level potential). Thus, the data "1" (high-level potential) is read.

Figure 23A:
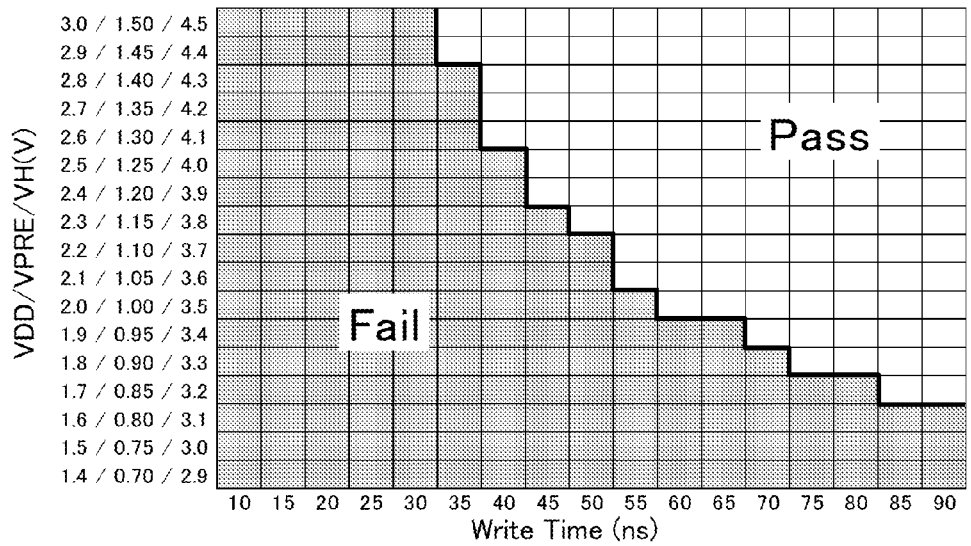
FIG. 23A is a Shmoo plot of power supply voltage conditions versus a time for writing data (Write Time) and FIG. 23B is a Shmoo plot of power supply voltage conditions versus a time for reading data (Read Time).
Figure 23B:
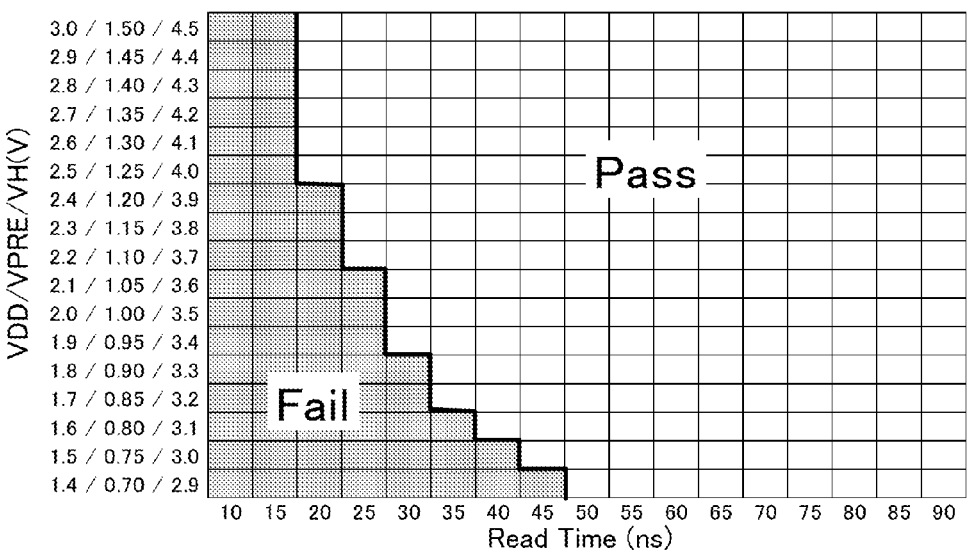

FIG. 23A and FIG. 23B show a Shmoo plot of power supply voltage conditions versus time for writing data to a memory cell (Write Time) and a Shmoo plot of power supply voltage conditions versus time for reading data from the memory cell (Read Time), respectively.

A "Shmoo plot" is a plot where the results of changing correlated parameters to measure mutual dependence between correlated parameters are plotted on a two-axis graph, that is, a plot visually showing the measurement results. In FIG. 23A, the horizontal axis and the vertical axis represent write time (Write Time) and conditions of power supply voltages (VDD, VPRE, and VH), respectively. In FIG. 23B, the horizontal axis and the vertical axis represent read time (Read Time) and conditions of power supply voltages (VDD, VPRE, and VH), respectively.

Here, the "Write Time" is a period from the rise of the potential CLE until the fall of the potential WLE, that is, a time from when data to be written is supplied until when a selection transistor of the memory cell is turned off (from when a selection transistor is turned on until when the selection transistor is turned off).

Further, the "Read Time" is defined as a period from the rise of the potential WLE until the rise of the potential SAE, that is, a time from when a potential at which the selection transistor of the memory cell is turned on is supplied until the selection transistor of the memory cell is turned on to drive the sense amplifier.

A shift in the potential DOUT to data "1" (high-level potential) and reading of the data "1" (high-level potential) actually occur after a shift in the potential CLE to the data "1" (high-level potential). However, the timing of outputting the potential DOUT of the data "1" (high-level potential) from the memory device to the outside depends on only the timing at which the potential CLE is changed to the data "1" (high-level potential). That is, in the memory device, the "Read Time" can be defined as a time from the rise of the potential WLE until the rise of the potential SAE, that is, from when a potential at which the selection transistor of the memory cell is turned on is supplied until the selection transistor of the memory cell is turned on to drive the sense amplifier.

The conditions of the power supply voltage based on the potential VDD were a potential VPRE of VDD/2 and a potential VH of VDD+1.5 V.

In FIG. 23A, "Pass" means that writing operation to all 8-kb memory cells is normally performed, and "Fail" means that the operation is not normally performed. In FIG. 23B, "Pass" means that reading operation from all 8-kb memory cells is normally performed, and "Fail" means that the operation is not normally performed.

The result was that the memory device of this example had a Write Time of 75 ns and the Read Time of 35 ns at rated VDD of 1.8 V.

Figure 24:
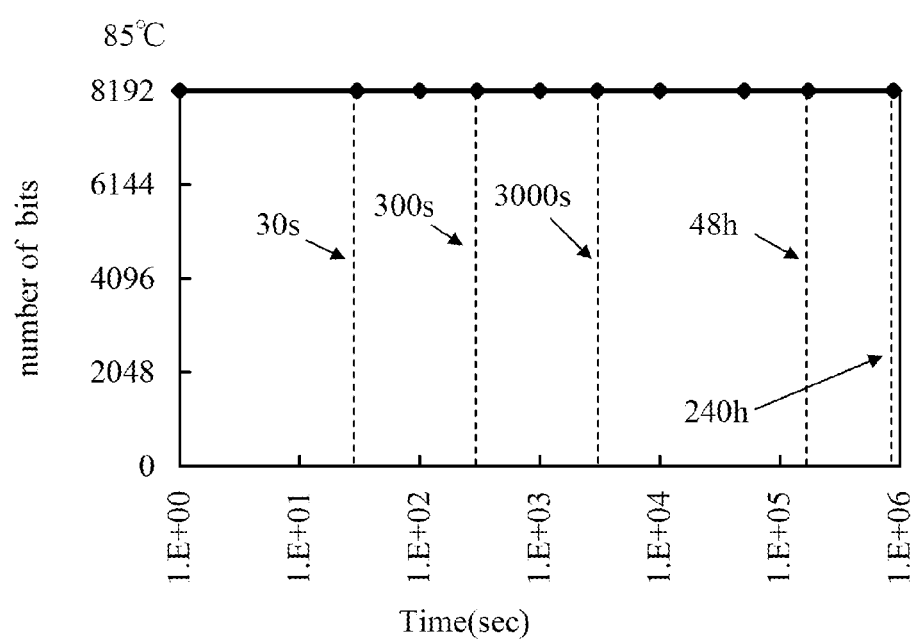
FIG. 24 is a graph showing retention characteristics of a memory device at 85° C.

FIG. 24 shows retention characteristics at 85° C. of the memory device of this example. FIG. 24 is a graph on which the number of bits of data normally retained for a predetermined time is plotted. It was confirmed from FIG. 24 that in the memory device of this example, all memory cells held data after a data retention period of 240 hours (10 days).

As described in this example, the memory device could have a sufficient data retention period and a high memory capacity per unit area. Alternatively according to this example, the memory device could have a lower incidence of errors and a higher memory capacity per unit area.

This application is based on Japanese Patent Application serial no. 2011-269712 filed with Japan Patent Office on Dec. 9, 2011 and Japanese Patent Application serial no. 2012-009731 filed with Japan Patent Office on Jan. 20, 2012, the entire contents of which are hereby incorporated by reference.

What is claimed is:

1. A memory device comprising:
   a driver circuit including a first bit line driver circuit, a second bit line driver circuit, a first word line driver circuit, and a second word line driver circuit;
   a first memory cell array including a first bit line and a first word line;
   a second memory cell array including a second bit line and a second word line;
   a third memory cell array including a third bit line and the second word line; and
   a fourth memory cell array including a fourth bit line and the first word line with the first memory cell array,
   wherein:
   each of the first to fourth memory cell arrays overlaps with the driver circuit,
   the first bit line driver circuit and the second bit line driver circuit are diagonally opposite to each other in the driver circuit,
   the first word line driver circuit and the second word line driver circuit are diagonally opposite to each other in driver circuit,
   the first and second bit line driver circuits and the first and second word line driver circuits are arranged so that in data writing, a signal is transmitted across the first bit line driver circuit toward a boundary between the first word line driver circuit and the first bit line driver circuit, a signal is transmitted across the second bit line driver circuit toward a boundary between the second word line driver circuit and the second bit line driver circuit, a signal is transmitted across the first word line driver circuit toward a boundary between the first bit line driver circuit and the first word line driver circuit, and a signal is transmitted across the second word line driver circuit toward a boundary between the second bit line driver circuit and the second word line driver circuit,
   the first word line is electrically connected to the second word line driver circuit via a connection point provided along a boundary between the first memory cell array and the fourth memory cell array,
   the second word line is electrically connected to the first word line driver circuit via a connection point provided along a boundary between the second memory cell array and the third memory cell array,
   the first bit line and the second bit line are electrically connected to the first bit line driver circuit via connection points provided along a boundary between the first memory cell array and the second memory cell array, and
   the third bit line and the fourth bit line are electrically connected to the second bit line driver circuit via connection points provided along a boundary between the third memory cell array and the fourth memory cell array.

2. The memory device according to claim 1, wherein:
   the first bit line driver circuit includes an amplifying element configured to amplify a potential difference between the first bit line and the second bit line, and
   the second bit line driver circuit includes an amplifying element configured to amplify a potential difference between the third bit line and the fourth bit line.

3. The memory device according to claim 1, wherein:
   the first and second bit line driver circuits each include a decoder, a selector and a reading circuit, and
   the first and second word line driver circuits each include a decoder, a level shifter, and a buffer.

4. The memory device according to claim 1, wherein:
   each of the first to fourth memory cell arrays comprises a memory cell,
   the memory cell comprises a transistor including an oxide semiconductor that is a switching element, and
   a storage capacitor electrically connected to one of a source and a drain of the oxide semiconductor transistor.

5. The memory device according to claim 4,
wherein each of the first bit line driver circuit, the second bit line driver circuit, the first word line driver circuit, and the second word line driver circuit comprises a transistor including a single crystal silicon.

6. A memory device comprising:
a driver circuit including a first bit line driver circuit, a second bit line driver circuit, a first word line driver circuit and a second word line driver circuit;
a first memory cell array including a first bit line and a first word line;
a second memory cell array including a second bit line and a second word line;
a third memory cell array including a third bit line and the second word line; and
a fourth memory cell array including a fourth bit line and the first word line with the first memory cell array,
wherein:
each of the first to fourth memory cell arrays overlaps with the driver circuit,
the first bit line driver circuit and the second bit line driver circuit are diagonally opposite to each other in the driver circuit,
the first word line driver circuit and the second word line driver circuit are diagonally opposite to each other in driver circuit,
the first bit line driver circuit comprises a first decoder, a first selector, and a first reading circuit arranged in this order, the first word line driver circuit includes a second decoder, a first level shifter, and a first buffer arranged in this order, the second bit line driver circuit includes a third decoder, a second selector, and a second reading circuit arranged in this order and the second word line driver circuit includes a fourth decoder, a second level shifter and a second buffer arranged in this order,
the first word line is electrically connected to the second buffer circuit via a connection point provided along a boundary between the first memory cell array and the fourth memory cell array,
the second word line is electrically connected to the first buffer via a connection point provided along a boundary between the second memory cell array and the third memory cell array,
the first bit line and the second bit line are electrically connected to the first reading circuit via connection points provided along a boundary between the first memory cell array and the second memory cell array, and
the third bit line and the fourth bit line are electrically connected to the second reading circuit via connection points provided along a boundary between the third memory cell array and the fourth memory cell array.

7. The memory device according to claim 6,
wherein:
the first bit line driver circuit includes an amplifying element configured to amplify a potential difference between the first bit line and the second bit line, and
the second bit line driver circuit includes an amplifying element configured to amplify a potential difference between the third bit line and the fourth bit line.

8. The memory device according to claim 6,
wherein:
each of the first to fourth memory cell arrays comprises a memory cell,
the memory cell comprises a transistor including an oxide semiconductor that is a switching element, and
a storage capacitor electrically connected to one of a source and a drain of the oxide semiconductor transistor.

9. The memory device according to claim 8,
wherein each of the first bit line driver circuit, the second bit line driver circuit, the first word line driver circuit, and the second word line driver circuit comprises a transistor including a single crystal silicon.

* * * * *